United States Patent
Ide

(10) Patent No.: US 8,031,001 B2
(45) Date of Patent: Oct. 4, 2011

(54) DIFFERENTIAL AMPLIFIER, REFERENCE VOLTAGE GENERATING CIRCUIT, DIFFERENTIAL AMPLIFYING METHOD, AND REFERENCE VOLTAGE GENERATING METHOD

(75) Inventor: Akira Ide, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 100 days.

(21) Appl. No.: 12/549,256

(22) Filed: Aug. 27, 2009

(65) Prior Publication Data

US 2010/0295618 A1    Nov. 25, 2010

(30) Foreign Application Priority Data

Aug. 28, 2008   (JP) .................................. 2008-219745

(51) Int. Cl.
*H03F 3/45*   (2006.01)
(52) U.S. Cl. .............................. 330/259; 330/9; 330/261
(58) Field of Classification Search .................. 330/259, 330/9, 261
See application file for complete search history.

(56) References Cited

U.S. PATENT DOCUMENTS

| | | | | |
|---|---|---|---|---|
| 5,471,169 A * | 11/1995 | Dendinger | ..................... | 327/563 |
| 5,777,514 A * | 7/1998 | Mittal et al. | ................... | 330/253 |
| 6,049,246 A * | 4/2000 | Kozisek et al. | .................... | 330/9 |
| 6,388,494 B1 * | 5/2002 | Kindt et al. | ..................... | 327/307 |
| 6,798,293 B2 * | 9/2004 | Casper et al. | ................. | 330/258 |
| 7,719,361 B2 * | 5/2010 | Pera | .............................. | 330/260 |
| 7,795,961 B2 * | 9/2010 | Kojima et al. | .................... | 330/9 |

FOREIGN PATENT DOCUMENTS

| | | |
|---|---|---|
| JP | 5-75431 | 3/1993 |
| JP | 2006-23920 | 1/2006 |
| JP | 2007-300623 | 11/2007 |

OTHER PUBLICATIONS

Banba, H., et al. (1999). "A CMOS Bandgap Reference Circuit with Sub-1-V Operation," IEEE Journal of Solid-State Circuits 34(5):670-674.

* cited by examiner

*Primary Examiner* — Patricia Nguyen
(74) *Attorney, Agent, or Firm* — Morrison & Foerster LLP

(57) ABSTRACT

A differential amplifier includes a main differential amplifier circuit that receives a pair of input signals and supplies a pair of output signals based on a difference between the input signals; and a bias control differential amplifier circuit that receives the pair of output signals, controls a control terminal of a current-limiting transistor making up the main differential amplifying circuit based on an offset voltage included in the output signals, and reduces the offset voltage.

8 Claims, 18 Drawing Sheets

DIFFERENTIAL AMPLIFIER, REFERENCE VOLTAGE GENERATING CIRCUIT, DIFFERENTIAL AMPLIFYING METHOD, AND REFERENCE VOLTAGE GENERATING METHOD

REFERENCE TO RELATED APPLICATION

This application is based upon and claims the benefit of the priority of Japanese patent application No. 2008-219745 filed on Aug. 28, 2008, the disclosure of which is incorporated herein in its entirety by reference thereto.

BACKGROUND OF THE INVENTION

1. Field of the Invention

The present invention relates to a differential amplifier, a reference voltage generating circuit in which the differential amplifier is used, a differential amplifying method, and a reference voltage generating method in which the differential amplifying method is adopted. Particularly the invention relates to a differential amplifier provided with a circuit that reduces an input offset, a reference voltage generating circuit in which the differential amplifier is used, a differential amplifying method in which the input offset is reduced, and a reference voltage generating method in which the differential amplifying method is adopted.

2. Description of the Related Art

Recently a power supply voltage used in an analog circuit tends to be lowered in order to achieve reduction of power consumption and speed enhancement. For example, Japanese Patent Application Laid-Open (JP-A) Nos. 2006-023920 (corresponding to U.S. Pat. No. 7,215,183), 2007-300623 (corresponding to U.S. Pat. No. 7,336,138), and H05-075431 disclose techniques regarding the differential amplifier applied to the analog circuit. A technique regarding the reference voltage generating circuit in which the differential amplifier is used is disclosed in H. Banba et al, "A CMOS Bandgap Reference Circuit with Sub-1-V Operation" in IEEE Journal of Solid-State Circuits, Vol. 34, No. 5, May 1999, p. 670-673 (hereinafter referred to as Non-Patent Document 1).

The entire disclosures of the aforementioned patent and Non-patent documents are incorporated herein by reference thereto.

However, in the reference voltage generating circuit disclosed in Non-Patent Document 1, the inventor shows that accuracy of output reference voltage is lowered with decreasing power supply voltage and a characteristic of the differential amplifier used has an influence on the lowering of the accuracy. FIG. 9 is a circuit diagram produced by the inventor based on the reference voltage generating circuit disclosed in Non-Patent Document 1, and FIG. 9 is an explanatory view illustrating the problem of the lowering of the accuracy of the reference voltage. In cases where the reference voltage generating circuit (reference voltage generating circuit in which a bandgap circuit is used) of FIG. 9 is operated at a low voltage, dependence of reference voltage output Vref on a power supply voltage is increased as the power supply voltage is lowered. When the dependence on the power supply voltage is increased, the reference voltage is largely changed by the slight change in power supply voltage, and therefore the reference voltage becomes unstable. This means the accuracy of the reference voltage comes down. A factor the dependence of the reference voltage output Vref on the power supply voltage is increased includes an insufficient output resistance of constant current source MOS (Metal Oxide Semiconductor) in an output stage and an input offset voltage generated by a finite gain of a differential amplifier used in the circuit, and the latter is the main factor. The input offset voltage of the differential amplifier, which becomes the main factor in lowering the accuracy of reference voltage supplied from the reference voltage generating circuit, will be described with reference to FIG. 18. The differential amplifier of FIG. 18 includes a differential pair of NMOS (N-type MOS) transistors and current mirror type load circuit of PMOS (P-type MOS) transistors, and an output is brought into contact with a negative input terminal to form a voltage follower circuit. When the differential amplifier has a sufficiently high amplification factor, potentials at a positive input terminal and an output terminal are equal to each other in the differential amplifier. However, because the differential amplifier has the finite amplification factor, a slight potential difference remains between the positive input voltage and the output voltage. This is the input offset voltage. The input offset will be described in detail. In the differential amplifier of FIG. 18, it is assumed that gm is mutual conductance of the differential pair of NMOS transistors and rds is a drain resistance of the current mirror type load circuit of the PMOS transistors that become a load. It is also assumed that VOUTb is a potential at gates commonly connected in the current mirror type load circuit of the PMOS transistors and VOUT is a potential at the outputs of the PMOS transistors. At this point, (VDD−VOUTb) is a drain-source voltage of the diode-connected PMOS transistor while (VDD−VOUT) is a drain-source voltage of the PMOS transistor connected to the output side. Accordingly, a drain voltage difference $\Delta VDSp$ between the PMOS transistors is expressed by an equation (1):

$$\Delta VDSp=(VDD-VOUTb)-(VDD-VOUT)=VOUT-VOUTb \quad (1)$$

A current error $\Delta Ip$ caused by the drain voltage difference $\Delta VDSp$ in the current mirror type load circuit is expressed by an equation (2):

$$\Delta Ip=\Delta VDSp/rds=(VOUT-VOUTb)/rsd \quad (2)$$

On the other hand, an input offset voltage $\Delta VIN$ is expressed by an equation (3):

$$\Delta VIN=VIN-VOUT \quad (3)$$

A current difference $\Delta In$ caused by the input offset voltage $\Delta VIN$ in the differential pair of NMOS transistors is expressed by an equation (4):

$$\Delta In=gm\cdot\Delta VIN=gm\cdot(VIN-VOUT) \quad (4)$$

Because $\Delta Ip$ and $\Delta In$ are equal to each other, the input offset voltage $\Delta VIN$ can be expressed as follows from the equations (2) and (4):

$$\Delta VIN=(VOUT-VOUTb)/(gm\cdot rsd) \quad (5)$$

As can be seen from the equation (5), there are two methods of reducing the input offset voltage $\Delta VIN$.

(1) A voltage amplification factor $Av=gm\cdot rds$ of the differential amplifier circuit is increased.

(2) The potential VOUTb at the gates commonly connected in the current mirror type load circuit of the PMOS transistors is equalized to the potential VOUT at the outputs of the PMOS transistors (VOUT=VOUTb).

As to the first method, the drain resistance rds is increased by forming the current mirror type load circuit into a cascode type load circuit, thereby increasing the voltage amplification factor $Av=gm\cdot rds$ of the differential amplifier circuit. However, disadvantageously an operating range of the power supply voltage is degraded by a voltage necessary for the cascode type load circuit. Therefore, particularly the first method is not suitable to a low-power circuit. As to the second method, the potential VOUTb at the gates commonly connected in the current mirror type load circuit of the PMOS transistors is substantially determined by threshold voltages of the PMOS transistors. On the other hand, the potential VOUT at the output of the current mirror type load circuit of the PMOS transistors is determined by a circuit configuration, and generally the potential VOUTb and the potential VOUT are hardly equalized to each other in any state. Although JP-A Nos. 2006-023920, 2007-300623, and H05-075431 disclose the reference voltage generating circuit operated at a low voltage, there is no suggestion about the influence of the input offset voltage on the accuracy of output voltage. Accordingly, even if the disclosed techniques are referred to, unfortunately there is no suggestion about the differential amplifier that can be used at a low voltage without the influence of the input offset voltage and the reference voltage generating circuit.

SUMMARY

The present invention seeks to solve one or more of the above problems, or to improve upon those problems at least in part.

In one embodiment, there is provided a differential amplifier includes a main differential amplifier circuit that receives a pair of input signals and supplies a pair of output signals based on a difference between the input signals, the main differential amplifier circuit including a current-limiting transistor; and a bias control differential amplifier circuit that receives the pair of output signals and controls a control terminal of the current-limiting transistor based on an offset voltage included in the output signals so as to reduce the offset voltage. Accordingly, in the differential amplifier in accordance with the first aspect of the invention, an input offset voltage generated by a finite gain of the main differential amplifier circuit can be detected by the bias control differential amplifier circuit that receives the pair of output signals of the main differential amplifier circuit. The bias control differential amplifier circuit detects a potential difference generated between the detected output signals, and the bias control differential amplifier circuit feeds a control signal for controlling a bias current of the main differential amplifier circuit to the main differential amplifier circuit based on the potential difference. In the main differential amplifier circuit, the bias current is controlled by the fed control signal, so that a potential difference generated between the pair of output signals of the main differential amplifier circuit can be reduced. In another embodiment, there is provided a differential amplifier includes a main differential amplifier circuit that includes a differential amplifier unit; and an open drain output circuit that amplifies a signal supplied from the main differential amplifier circuit, wherein when an offset voltage included in a differential output signal of the differential amplifier unit is detected, an operating point of the differential amplifier unit is controlled based on the offset voltage so as to reduce the offset voltage. Accordingly, in the differential amplifier in accordance with the second aspect of the invention, the input offset voltage generated by the finite gain of the main differential amplifier circuit can be detected by the bias control differential amplifier circuit that is connected between a complementary pair of output terminals of the main differential amplifier circuit. The bias control differential amplifier circuit detects the potential difference between the output terminals, and the bias control differential amplifier circuit feeds the control signal for controlling the bias current of the main differential amplifier circuit to the main differential amplifier circuit based on the potential difference.

In the main differential amplifier circuit, the bias current is controlled by the fed control signal, so that the potential difference generated between the complementary output terminals of the main differential amplifier circuit can be reduced. In accordance with a third aspect of the invention, a reference voltage generating circuit in which a bandgap circuit including a differential amplifier is used, wherein the differential amplifier is the differential amplifier in accordance with the first aspect of the invention. Accordingly, the third aspect of the invention can provide the high-output-accuracy reference voltage generating circuit in which the offset voltage that becomes an error to the detected potential difference can be reduced in the differential amplifier that detects the potential difference between the forward voltages of the semiconductor elements provided in two current passages.

Specifically, in the differential amplifier, the main differential amplifier circuit includes a first first-conductivity-type transistor whose gate is connected to a negative input terminal, a second first-conductivity-type transistor in which a gate is connected to a positive input terminal and a source is connected to a source of the first first-conductivity-type transistor, a third first-conductivity-type transistor in which a source is connected to a first power supply and a drain is connected to the source of the first first-conductivity-type transistor, a second-conductivity-type transistor in which a source is connected to a second power supply that is different from the first power supply, a drain is connected to a drain of the first first-conductivity-type transistor, and a gate is connected to the drain of itself, and a second second-conductivity-type transistor in which a source is connected to the second power supply, a drain is connected to the drain of the second first-conductivity-type transistor, and a gate is connected to the gate of the first second-conductivity-type transistor, the open drain output circuit includes a third second-conductivity-type transistor in which a source is connected to the second power supply, a gate is connected to the drain of the second second-conductivity-type transistor, and a drain is connected to an output terminal, and the bias control differential amplifier circuit includes a fourth second-conductivity-type transistor in which a source is connected to the second power supply and a gate is connected to the drain of the first second-conductivity-type transistor, a fifth second-conductivity-type transistor in which a source is connected to the second power supply, a gate is connected to the drain of the second second-conductivity-type transistor, and a drain is connected to the gate of the third first-conductivity-type transistor, a fourth first-conductivity-type transistor in which a source is connected to the first power supply, a drain is connected to drain of the fourth second-conductivity-type transistor, and a gate is connected to the drain of itself, and a fifth first-conductivity-type transistor in which a source is connected to the first power supply, a drain is connected to the drain of the fifth second-conductivity-type transistor, and a gate is connected to the gate of the fourth first-conductivity-type transistor. The first-conductivity-type transistor, the second-conductivity-type transistor, the first power supply, and the second power supply are a combination of the N-type MOS transistor (NMOS), the P-type MOS transistor (PMOS), the ground potential VSS, and the power supply VDD or a combination of the P-type MOS transistor (PMOS), the N-type MOS transistor (NMOS), the power supply VDD, and the ground potential VSS.

Further, in the differential amplifier, the main differential amplifier circuit includes the first first-conductivity-type transistor whose gate is connected to the negative input terminal, the second first-conductivity-type transistor in which the gate is connected to the positive input terminal and the source is connected to the source of the first first-conductivity-type transistor, the third first-conductivity-type transistor in which the source is connected to the first power supply and the drain is connected to the source of the first first-conductivity-type transistor, the first second-conductivity-type transistor in which the source is connected to the second power supply, the drain is connected to the drain of the first first-conductivity-type transistor, and the gate is connected to the drain of itself, a sixth second-conductivity-type transistor in which a source is connected to the second power supply and a gate is connected to the gate of the first second-conductivity-type transistor, a sixth first-conductivity-type transistor in which a source is connected to the first power supply, a drain is connected to the drain of the sixth second-conductivity-type transistor, and a gate is connected to the drain of itself, an eighth first-conductivity-type transistor in which a source is connected to the first power supply and a gate is connected to the gate of the sixth first-conductivity-type transistor, the second second-conductivity-type transistor in which the source is connected to the second power supply, the drain is connected to the drain of the second first-conductivity-type transistor, and the gate is connected to the drain of itself, a seventh second-conductivity-type transistor in which a source is connected to the second power supply and a gate is connected to the gate of the second second-conductivity-type transistor, a seventh first-conductivity-type transistor in which a source is connected to the first power supply, a drain is connected to the drain of the seventh second-conductivity-type transistor, and a gate is connected to the drain of itself, a ninth first-conductivity-type transistor in which a source is connected to the first power supply and a gate is connected to the gate of the seventh first-conductivity-type transistor, an eighth second-conductivity-type transistor in which a source is connected to the second power supply, a drain is connected to the drain of the eighth first-conductivity-type transistor, and a gate is connected to the drain of itself, and a ninth second-conductivity-type transistor in which a source is connected to the second power supply, a drain is connected to the drain of the ninth first-conductivity-type transistor, and a gate is connected to the gate of the eighth second-conductivity-type transistor, the open drain output circuit includes the third second-conductivity-type transistor in which the source is connected to the second power supply, the gate is connected to the drain of the ninth second-conductivity-type transistor, and the drain is connected to the output terminal, and the bias control differential amplifier circuit includes the fourth second-conductivity-type transistor in which the source is connected to the second power supply and the gate is connected to the drain of the eighth second-conductivity-type transistor, the fifth second-conductivity-type transistor in which the source is connected to the second power supply, the gate is connected to the drain of the ninth second-conductivity-type transistor, and the drain is connected to the gate of the third first-conductivity-type transistor, the fourth first-conductivity-type transistor in which the source is connected to the first power supply, the drain is connected to the drain of the fourth second-conductivity-type transistor, and the gate is connected to the drain of itself, and the fifth first-conductivity-type transistor in which the source is connected to the first power supply, the drain is connected to the drain of the fifth second-conductivity-type transistor, and the gate is connected to the gate of the fourth first-conductivity-type transistor.

Further, in the differential amplifier, the main differential amplifier circuit includes the first first-conductivity-type transistor whose gate is connected to the negative input terminal, the second first-conductivity-type transistor in which the gate is connected to the positive input terminal and the source is connected to the source of the first first-conductivity-type transistor, the third first-conductivity-type transistor in which the source is connected to the first power supply and the drain is connected to the source of the first first-conductivity-type transistor, the first second-conductivity-type transistor in which the source is connected to the second power supply, the drain is connected to the drain of the first first-conductivity-type transistor, and the gate is connected to the drain of itself, the sixth second-conductivity-type transistor in which the source is connected to the second power supply and the gate is connected to the gate of the first second-conductivity-type transistor, the sixth first-conductivity-type transistor in which the source is connected to the first power supply, the drain is connected to the drain of the sixth second-conductivity-type transistor, and the gate is connected to the drain of itself, the eighth first-conductivity-type transistor in which the source is connected to the first power supply and the gate is connected to the gate of the sixth first-conductivity-type transistor, the second second-conductivity-type transistor in which the source is connected to the second power supply, the drain is connected to the drain of the second first-conductivity-type transistor, and the gate is connected to the drain of itself, the seventh second-conductivity-type transistor in which the source is connected to the second power supply and the gate is connected to the gate of the second second-conductivity type-transistor, the seventh first-conductivity-type transistor in which the source is connected to the first power supply, the drain is connected to the drain of the seventh second-conductivity-type transistor, and the gate is connected to the drain of itself, the ninth first-conductivity-type transistor in which the source is connected to the first power supply and the gate is connected to the gate of the seventh first-conductivity-type transistor, the eighth second-conductivity-type transistor in which the source is connected to the second power supply, the drain is connected to the drain of the eighth first-conductivity-type transistor, and the gate is connected to the drain of itself, and the ninth second-conductivity-type transistor in which the source is connected to the second power supply, the drain is connected to the drain of the ninth first-conductivity-type transistor, and the gate is connected to the gate of the eighth second-conductivity-type transistor, the open drain output circuit includes the third second-conductivity-type transistor in which the source is connected to the second power supply, the gate is connected to the drain of the ninth second-conductivity-type transistor, and the drain is connected to the output terminal, the bias control differential amplifier circuit includes the fifth second-conductivity-type transistor in which the source is connected to the second power supply, the gate is connected to the drain of the ninth second-conductivity-type transistor and the drain is connected to the gate of the third first-conductivity-type transistor and the fifth first-conductivity-type transistor in which the source is connected to the first power supply, the drain is connected to the drain of the fifth second-conductivity-type transistor, and the gate is connected to the gate of the sixth first-conductivity-type transistor.

Further, in the differential amplifier, the main differential amplifier circuit includes the first first-conductivity-type transistor whose gate is connected to the negative input terminal, the second first-conductivity-type transistor in which the gate is connected to the positive input terminal and the source is connected to the source of the first first-conductivity-type transistor, the third first-conductivity-type transistor in which the source is connected to the first power supply and the drain is connected to the source of the first first-conductivity-type transistor, the first second-conductivity-type transistor in which the source is connected to the second power supply, the drain is connected to the drain of the first first-conductivity-type transistor, and the gate is connected to the drain of itself, the sixth second-conductivity-type transistor in which the source is connected to the second power supply and the gate is connected to the gate of the first second-conductivity-type transistor, the sixth first-conductivity-type transistor in which the source is connected to the first power supply, the drain is connected to the drain of the sixth second-conductivity-type transistor, and the gate is connected to the drain of itself, the eighth first-conductivity-type transistor in which the source is connected to the first power supply and the gate is connected to the gate of the sixth first-conductivity-type transistor, the second second-conductivity-type transistor in which the source is connected to the second power supply, the drain is connected to the drain of the second first-conductivity-type transistor, and the gate is connected to the drain of itself, the seventh second-conductivity-type transistor in which the source is connected to the second power supply and the gate is connected to the gate of the second second-conductivity-type transistor, the seventh first-conductivity-type transistor in which the source is connected to the first power supply, the drain is connected to the drain of the seventh second-conductivity-type transistor, and the gate is connected to the drain of itself, the ninth first-conductivity-type transistor in which the source is connected to the first power supply and the gate is connected to the gate of the seventh first-conductivity-type transistor, the eighth second-conductivity-type transistor in which the source is connected to the second power supply, the drain is connected to the drain of the eighth first-conductivity-type transistor, and the gate is connected to the drain of itself, and the ninth second-conductivity-type transistor in which the source is connected to the second power supply, the drain is connected to the drain of the ninth first-conductivity-type transistor, the gate is connected to the gate of the eighth second-conductivity-type transistor, the open drain output circuit includes the third second-conductivity-type transistor in which the source is connected to the second power supply, the gate is connected to the drain of the ninth second-conductivity-type transistor, and the drain is connected to the output terminal, and the bias control differential amplifier circuit includes the fifth second-conductivity-type transistor in which the source is connected to the second power supply, the gate is connected to the drain of the ninth second-conductivity-type transistor, the drain is connected to the gate of the third first-conductivity-type transistor and the fifth first-conductivity-type transistor in which the source is connected to the first power supply, the drain is connected to the drain of the fifth second-conductivity-type transistor, and the gate is connected to the gate of the seventh first-conductivity-type transistor.

Further, in the differential amplifier, the main differential amplifier circuit includes the first first-conductivity-type transistor whose gate is connected to the negative input terminal, the second first-conductivity-type transistor in which the gate is connected to the positive input terminal and the source is connected to the source of the first first-conductivity-type transistor, the third first-conductivity-type transistor in which the source is connected to the first power supply and the drain is connected to the source of the first first-conductivity-type transistor, the first second-conductivity-type transistor in which the source is connected to the second power supply, the drain is connected to the drain of the first first-conductivity-type transistor, and the gate is connected to the drain of itself, the sixth second-conductivity-type transistor in which the source is connected to the second power supply and the gate is connected to the gate of the first second-conductivity-type transistor, the sixth first-conductivity-type transistor in which source is connected to the first power supply, the drain is connected to the drain of the sixth second-conductivity-type transistor, the gate is connected to the drain of itself, the second second-conductivity-type transistor in which the source is connected to the second power supply, the drain is connected to the drain of the second first-conductivity-type transistor, and the gate is connected to the drain of itself, the seventh second-conductivity-type transistor in which the source is connected to the second power supply and the gate is connected to the gate of the second second-conductivity-type transistor, the seventh first-conductivity-type transistor in which the source is connected to the first power supply, the drain is connected to the drain of the seventh second-conductivity-type transistor, and the gate is connected to the gate of the sixth first-conductivity-type transistor, the open drain output circuit includes a fourteenth first-conductivity-type transistor in which a source is connected to the first power supply, a gate is connected to the drain of the seventh first-conductivity-type transistor, and the drain is connected to the output terminal, and the bias control differential amplifier circuit includes the fourth first-conductivity-type transistor in which the source is connected to the first power supply and the gate is connected to the gate of the sixth first-conductivity-type transistor, the fifth first-conductivity-type transistor in which the source is connected to the first power supply and the gate is connected to the drain of the seventh first-conductivity-type transistor, the fourth second-conductivity-type transistor in which the source is connected to the second power supply, the drain is connected to the drain of the fourth first-conductivity-type transistor, and the gate is connected to the drain of itself, and the fifth second-conductivity-type transistor in which the source is connected to the second power supply, the drain is connected to the drain of the fifth first-conductivity-type transistor, and the gate is connected to the gate of the fourth second-conductivity-type transistor.

In another embodiment, there is provided a reference voltage generating circuit in which a bandgap circuit including a differential amplifier is used, wherein the differential amplifier is the differential amplifier described above.

In another embodiment, there is provided a differential amplifying method includes: accepting input signals to a pair of complementary input terminals of a main differential amplifier circuit; obtaining a complementary signals by amplifying the input signals based on a control signal defining a bias current and supplied to a control terminal of the main differential amplifier circuit; outputting the complementary signals from a complementary pair of output terminals of the main differential amplifier circuit; supplying one of the complementary signals to a MOS transistor; outputting a signal from a drain of a MOS transistor; obtaining the control signal by differential amplifying the first complementary signals; and supplying the control signal to the control terminal.

In another embodiment, there is provided a reference voltage generating method by a reference voltage generating circuit including a bandgap power supply and a differential amplifier unit, the differential amplifier unit including a main differential amplifier circuit performing overall differential amplification and a open drain output circuit amplifying a differential output signal supplied from the main differential amplifier circuit, the differential amplifier unit outputs a signal amplified by the open drain output circuit, the reference voltage generating method comprising: supplying signals outputted from the bandgap power supply to the main differential amplifier circuit; detecting an offset voltage included in a differential output signal outputted from the differential amplifier unit as the differential amplifier unit accepts the signals outputted from the bandgap power supply; and reducing the offset voltage included in the differential output signals by controlling an operating point of the main differential amplifier unit based on the offset voltage.

Accordingly, in the invention, the influence of the fluctuation in power supply voltage is reduced in the output signal voltage supplied from the open drain output circuit connected to the complementary output terminals of the main differential amplifier circuit, so that the differential amplifier having high stability against the fluctuation in power supply voltage can be obtained. Further, the reference voltage generating circuit having high stability can be obtained by applying the differential amplifier to the reference voltage generating circuit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE INVENTION

Preferred embodiments of the present invention will be explained below in detail with reference to the accompanying drawings.

A differential amplifier and a reference voltage generating circuit according to one exemplary embodiment of the invention will be described below with reference to the drawings.

First Embodiment

Figure 1:
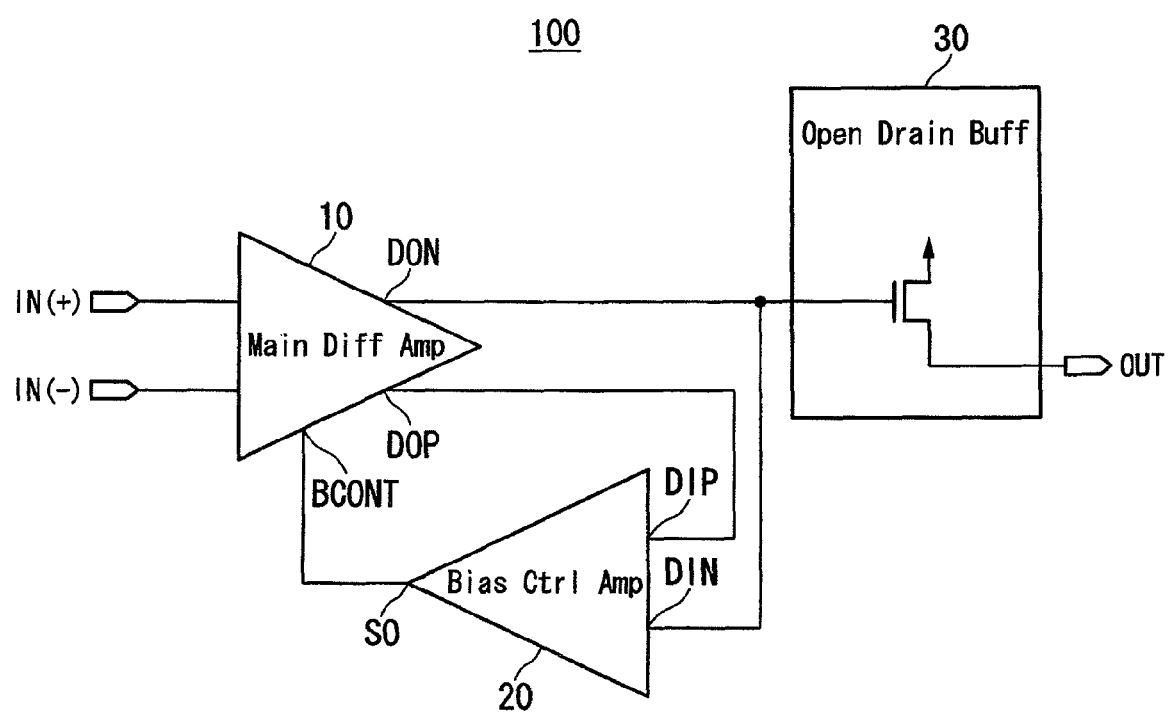
FIG. 1 is a schematic block diagram illustrating a differential amplifier according to a first embodiment of the invention.

FIG. 1 is a schematic block diagram illustrating a differential amplifier 100 according to a first embodiment of the invention. In the differential amplifier 100, a schematic configuration of the differential amplifier of the embodiment is illustrated in units of the typical circuits. The differential amplifier 100 includes a main differential amplifier circuit (Main Diff Amp) 10, a bias control differential amplifier circuit (Bias Ctrl Amp) 20, and an open drain output circuit (Open Drain Buff) 30.

In the differential amplifier 100, the main differential amplifier circuit 10 is an overall differential amplifier circuit (overall differential amplifier unit) including differential input terminals (pair of complementary input terminals) and differential output terminals (output terminals becoming a complementary pair). The differential input terminals constitute a pair of a positive input terminal IN(+) and a negative input terminal IN(−). The differential output terminals constitute a pair of a positive output terminal DOP and a negative output terminal DON. In the main differential amplifier circuit 10, when the positive input terminal IN(+) has the high voltage in the differential input terminal that is of the pair of the positive input terminal IN(+) and the negative input terminal IN(−), the high voltage is supplied to the positive output terminal DOP, and the low voltage is supplied to the negative output terminal DON. A control terminal BCONT is provided in the main differential amplifier circuit 10, and a control signal for controlling a bias current is fed into the control terminal BCONT. In the main differential amplifier circuit 10, input signals fed into the differential input terminals are amplified by an operating characteristic in an operating point defined by the bias current control signal fed into the control terminal BCONT, and the amplified input signals are supplied to the differential output terminal. The bias control differential amplifier circuit 20 is a differential amplifier circuit including differential input terminals (pair of complementary input terminals) and a single-end output terminal SO. The differential input terminals constitute a pair of a positive input terminal DIP and a negative input terminal DIN. The open drain output circuit 30 is an open drain output circuit including at least one MOS (Metal Oxide Semiconductor) transistor.

The differential input terminals (DIP and DIN) of the bias control differential amplifier circuit 20 are connected to the differential output terminals (DOP and DON) of the main differential amplifier circuit 10. The positive output terminal DOP and negative output terminal DON that are of the pair of differential output terminals of the main differential amplifier circuit 10 are connected to the positive input terminal DIP and negative input terminal DIN that are of the pair of differential input terminals of the bias control differential amplifier circuit 20, respectively. The control terminal BCONT of the main differential amplifier circuit 10 is connected to the output SO of the bias control differential amplifier circuit 20. A gate of a MOS transistor of the open drain output circuit 30 is connected to the output terminal (DON) of the differential output terminals of the main differential amplifier circuit 10, and a drain of the MOS transistor is connected to an output terminal.

In the differential amplifier 100, the main differential amplifier circuit 10 amplifies signals fed into the differential input terminals constituting the pair of the positive input terminal IN(+) and the negative input terminal IN(−), and the main differential amplifier circuit 10 supplies the amplified signals to the differential output terminals (DOP and DON). The main differential amplifier circuit 10 feeds the signal to the open drain output circuit 30 that is connected to the output terminal DON of the main differential amplifier circuit 10. The open drain output circuit 30 amplifies the fed signal and supplies the amplified signal to the output terminal. The bias control differential amplifier circuit 20 detects a potential difference between the positive output terminal DOP and negative output terminal DON of the differential output terminals of the main differential amplifier circuit 10 and feeds the signal for controlling the bias current of the main differential amplifier circuit 10 to the main differential amplifier circuit 10 in order to control the operating point of the main differential amplifier circuit 10 according to the detected potential difference. That is, the differential amplifier circuit 100 of the first embodiment includes the main differential amplifier circuit 10 that amplifies the input signal by the characteristic in the defined operating point, the bias control differential amplifier circuit 20 that amplifies the potential difference between the differential output terminals of the main differential amplifier circuit 10 and controls the operating point of the main differential amplifier circuit 10, and the open drain output circuit 30 that amplifies and supplies the output signal of the main differential amplifier circuit 10.

Figure 2:
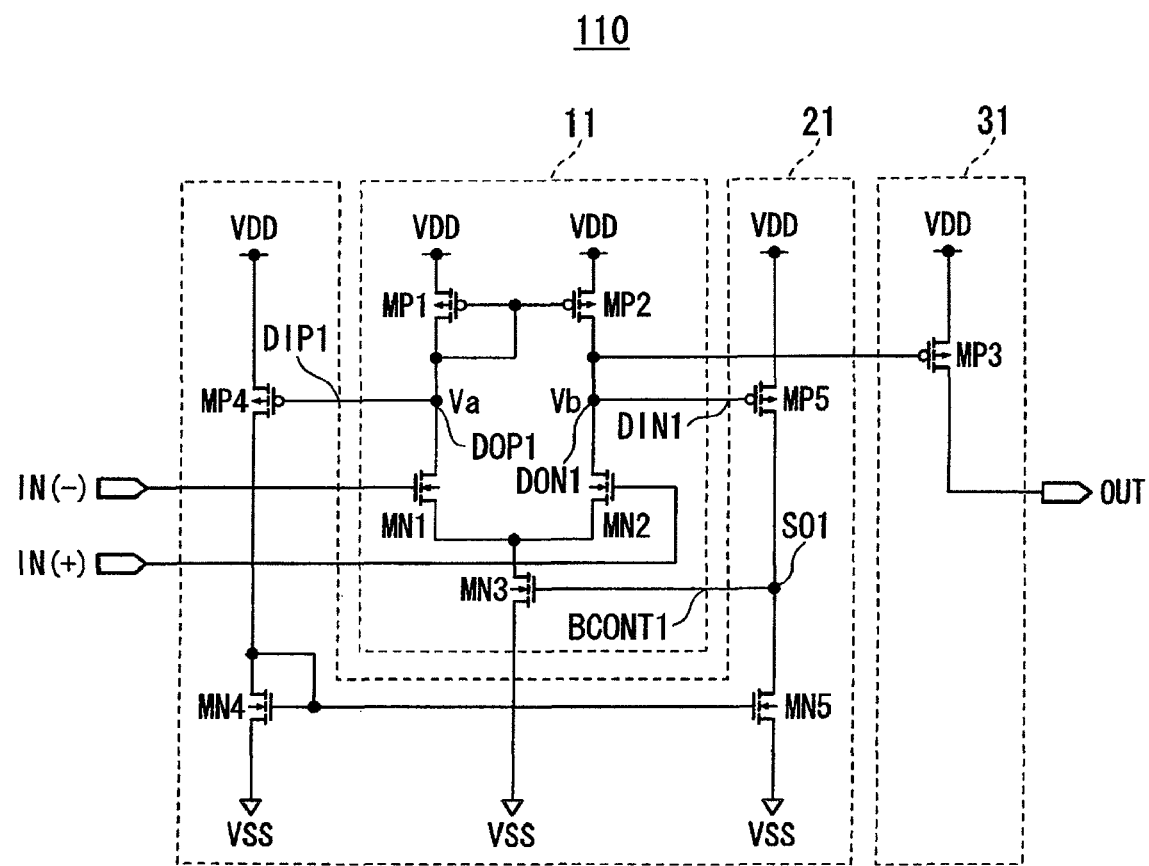
FIG. 2 is a block diagram (part 1) illustrating the differential amplifier of the first embodiment.

A configuration of a differential amplifier 110 that is of a specific example of the differential amplifier 100 will be described with reference to FIG. 2. FIG. 2 is a block diagram illustrating the differential amplifier 110. The differential amplifier 110 includes a main differential amplifier circuit 11, a bias control differential amplifier circuit 21, and an open drain output circuit 31. The main differential amplifier circuit 11 of the differential amplifier 110 includes an N-type MOS field effect transistors (hereinafter referred to as "NMOS") NMOS MN1, NMOS MN2, and NMOS MN3 and P-type MOS field effect transistors (hereinafter referred to as "PMOS") PMOS MP1 and PMOS MP2. In the main differential amplifier circuit 11, a gate of NMOS MN1 is connected to the negative input terminal IN(−), a gate of NMOS MN2 is connected to the positive input terminal IN(+), and a source of NMOS MN2 is connected to a source of NMOS MN1. In NMOS MN3, a source is connected to a ground potential VSS, a drain is connected to the source of NMOS MN1, and a gate is set to a circuit point BCONT1. In PMOS MP1, a source is connected to a power supply VDD, a drain indicating a circuit point DOP1 is connected to the drain of NMOS MN1, and a gate is connected to the drain of itself. In PMOS MP2, a source is connected to the power supply VDD, a drain indicating a circuit point DON1 is connected to the drain of NMOS MN2, and a gate is connected to the gate of PMOS MP1.

The bias control differential amplifier circuit 21 includes NMOS MN4, NMOS MN5, PMOS MP4, and PMOS MP5. In PMOS MP4 of the bias control differential amplifier circuit 21, a source is connected to the power supply VDD, a gate indicating a circuit point DIP1 is connected to the drain (circuit point DOP1) of PMOS MP1. In PMOS MP5, a source is connected to the power supply VDD, a gate indicating a circuit point DIN1 is connected to the drain (circuit point DON1) of PMOS MP2, and a drain indicating the circuit point SO1 is connected to the gate of NMOS MN3. In NMOS MN4, a source is connected to the ground potential VSS, a drain is connected to the drain of PMOS MP4, and a gate is connected to the drain of itself. In NMOS NM5, a source is connected to the ground potential VSS, the drain is connected to the drain of PMOS MP5, and a gate is connected to the gate of NMOS MN4.

The open drain output circuit 31 includes PMOS MP3. In PMOS MP3 of the open drain output circuit 31, a source is connected to the power supply VDD, a gate is connected to the drain (circuit point DON1) of PMOS MP2, and a drain is connected to the output terminal OUT. When the connections between the components are organized, the differential input terminals (DIP1 and DIN1) of the bias control differential amplifier circuit 21 are connected to the differential output terminals (DOP1 and DON1) of the main differential amplifier circuit 11. The pair of the positive output terminal DOP1 and negative output terminal DON1 that is of the differential output terminals of the main differential amplifier circuit 11 are connected to the pair of the positive input terminal DIP1 and negative input terminal DIN1 that is of the differential input terminals of the bias control differential amplifier circuit 21, respectively. The control terminal BCONT1 of the main differential amplifier circuit 11 is connected to the output SO1 of the bias control differential amplifier circuit 21. The gate of MOS trangistor 31 of the open drain output circuit 30 is connected to the output terminal (DON1) of the differential output terminals of the main differential amplifier circuit 11, and the drain of MOS trangistor 31 is connected to the output terminal.

Figure 3:
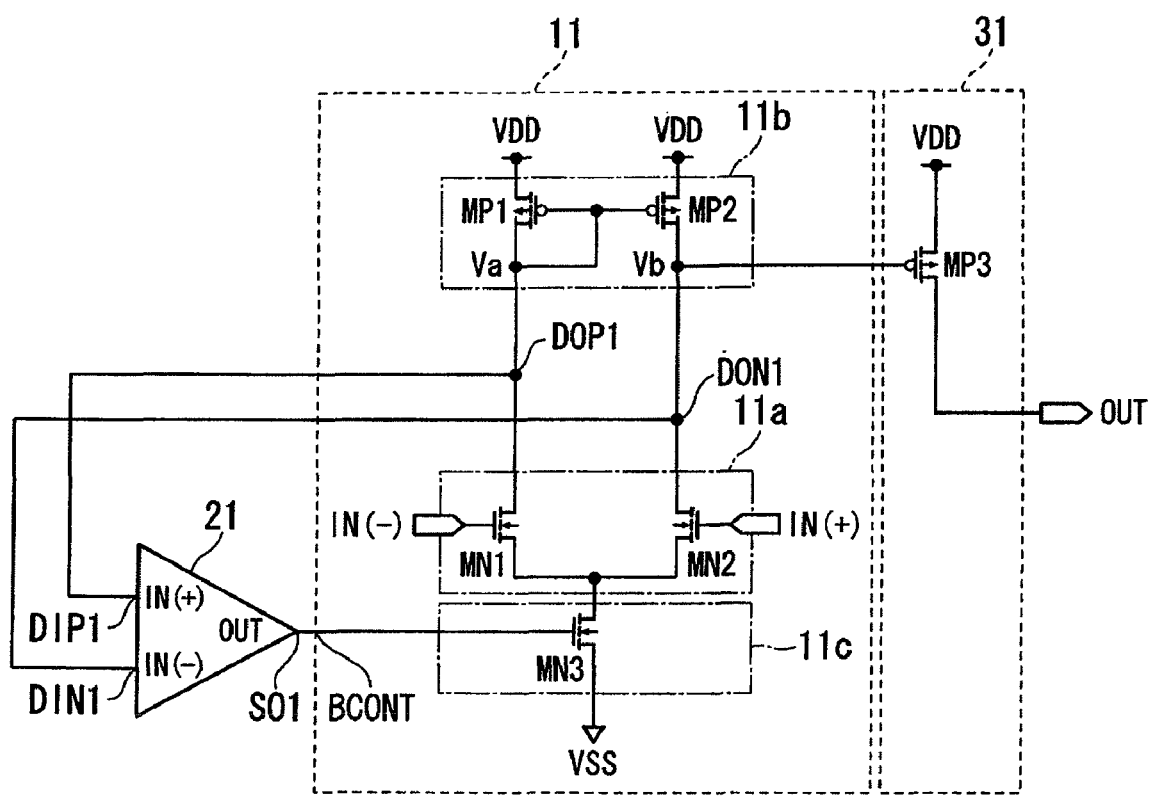
FIG. 3 is a block diagram (part 2) illustrating the differential amplifier of the first embodiment.

An operation of the differential amplifier 110 of FIG. 2 will be described with reference to FIG. 3. FIG. 3 is a block diagram illustrating a simplified configuration of the differential amplifier 110. In the differential amplifier 110 of FIG. 3, the same component as that of FIG. 2 is designated by the same numeral, and the different point is described. The main differential amplifier circuit 11 of the differential amplifier 110 includes a differential circuit 11a having NMOS MN1 and NMOS MN2, a current mirror circuit 11b having PMOS MP1 and PMOS MP2 that constitute a load of the differential circuit 11a, and a constant current circuit 11c having NMOS MN3 that sets the operating point of the differential circuit 11a. The bias control differential amplifier circuit 21 is collectively expressed as one amplifier.

The operation of the main differential amplifier circuit 11 in the case where an input offset voltage ΔVin is adjusted to zero will be described. The drains of PMOS MP1 and PMOS MP2 of the main differential amplifier circuit 11, that is, the circuit point DOP1 and circuit point DON1 are set to potentials Va and Vb. At this point, the input offset voltage ΔVin of the main differential amplifier circuit 11 can be express by an equation (6):

$$\Delta Vin = (Va - Vb)/(gm \cdot rds) \quad (6)$$

Where gm is mutual conductance of NMOS MN1 and NMOS MN2 and rds is drain resistances of PMOS MP1 and PMOS MP2. The bias control differential amplifier circuit 21 controls a bias voltage applied to the circuit point BCONT1 to adjust a tail current I0 passed through NMOS MN3 such that the potentials Va and Vb at the circuit point DOP1 and circuit point DON1 are equalized to each other. The potentials Va and Vb at the circuit point DOP1 and circuit point DON1 are substantially equalized to each other (Va≈Vb) by the control of the bias control differential amplifier circuit 21. That is, even if a gain has a finite value in the main differential amplifier circuit 11 (Av=gm·rds), the input offset voltage ΔVin substantially becomes 0V (volt) as expressed by the equation (6) (ΔVin≈0).

Second Embodiment

Figure 4:
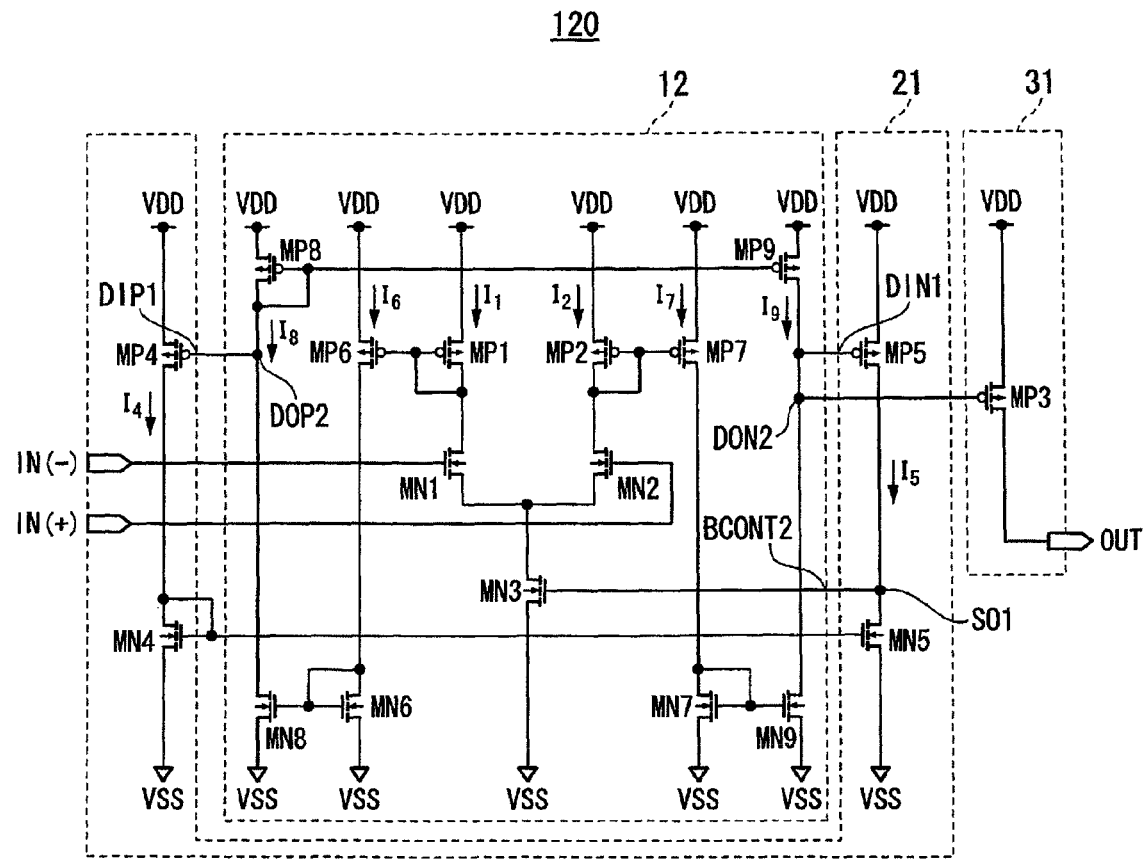
FIG. 4 is a block diagram illustrating the differential amplifier of the second embodiment.

A configuration of a differential amplifier 120 that is of an example of the differential amplifier 100 according to a second embodiment will be described with reference to FIG. 4. FIG. 4 is a block diagram illustrating the differential amplifier 120. The differential amplifier 120 includes a main differential amplifier circuit 12, the bias control differential amplifier circuit 21, and the open drain output circuit 31. In the differential amplifier 120 of FIG. 4, the same component as that of FIG. 2 is designated by the same numeral, and the main differential amplifier circuit 12 having the different configuration is described. The main differential amplifier circuit 12 of the differential amplifier 120 includes NMOS MN1, NMOS MN2, NMOS MN3, NMOS MN6, NMOS MN7, NMOS MN8, NMOS MN9, PMOS MP1, PMOS MP2, PMOS MP6, PMOS MP7, PMOS MP8, and PMOS MP9.

In the main differential amplifier circuit 12, the gate of NMOS MN1 is connected to the negative input terminal IN(−), the gate of NMOS MN2 is connected to the positive input terminal IN(+), and the source of NMOS MN2 is connected to the source of NMOS MN1. In NMOS MN3, the gate indicates a circuit point BCONT2, the source is connected to a ground potential VSS, and the drain is connected to the source of NMOS MN1. In PMOS MP1, the source is connected to the power supply VDD, the drain is connected to the drain of NMOS MN1, and the gate is connected to the drain of itself. In PMOS MP6, the source is connected to the power supply VDD, and the gate is connected to the gate of PMOS MP1. In NMOS MN6, the source is connected to the ground potential VSS, the drain is connected to the drain of PMOS MP6, and the gate is connected to the drain of itself. In NMOS MN8, the source is connected to the ground potential VSS, and the gate is connected to the gate of NMOS MN6.

In PMOS MP2, the source is connected to the power supply VDD, the drain is connected to the drain of NMOS MN2, and the gate is connected to the drain of itself. In PMOS MP7, the source is connected to the power supply VDD, and the gate is connected to the gate of PMOS MP2. In NMOS MN7, the source is connected to the ground potential VSS, the drain is connected to the drain of PMOS MP7, and the gate is connected to the drain of itself. In NMOS MN9, the source is connected to the ground potential VSS, and the gate is connected to the gate of NMOS MN7. In PMOS MP8, the source is connected to the power supply VDD, the drain indicating a circuit point DOP2 is connected to the drain of NMOS MN8, and the gate is connected to the drain of itself. In PMOS MP9, the source is connected to the power supply VDD, the drain indicating a circuit point DON2 is connected to the drain of NMOS MN9, and the gate is connected to the gate of PMOS MP8.

The connection between the main differential amplifier circuit 12 and the bias control differential amplifier circuit 21 and open drain output circuit 31 will be described below. The circuit point DIP1 of the bias control differential amplifier circuit 21 is connected to the drain of PMOS MP8 indicating the circuit point DOP2. The circuit point DIN1 of the bias control differential amplifier circuit 21 is connected to the drain of PMOS MP9 indicating the circuit point DON2. The circuit point SO1 of the bias control differential amplifier circuit 21 is connected to the gate of NMOS MN3 indicating the circuit point BCONT2. The gate indicating the input of the open drain output circuit 31 is connected to the drain of PMOS MP9 indicating the circuit point DON2.

The differential amplifier 120 is a circuit applying in the case in which the large load is connected or in the case in which an output amplitude range (dynamic range) of the main differential amplifier circuit 12 is spread to the substantial power supply voltage range. In addition to the main differential amplifier circuit 11, the amplifier circuit having the current mirror configuration is added to the main differential amplifier circuit 12. The amplifier circuit includes PMOS MP6, PMOS MP7, PMOS MP8, PMOS MP9, NMOS MN6, NMOS MN7, NMOS MN8, and NMOS MN9. In the drain of PMOS MP9 and the drain of NMOS MN9 (circuit point DON2), the output amplitude range (dynamic range) of the main differential amplifier circuit can be spread to the substantial power supply voltage range.

For example, in the main differential amplifier circuit 11, it could be that the gate-source voltages VGS of PMOS MP1 and PMOS MP2 cannot be increased until the offset voltage between the output terminals becomes zero, when the load connected to the output terminal OUT has the large current value, therefore PMOS MP3 has the large gate-source voltage VGS (MP3). This is because the dynamic range is restricted by a fluctuation range of the potential at the commonly connected sources of NMOS MN1 and NMOS MN2. On the other hand, in the main differential amplifier circuit 12, the gate-source voltages VGS (MP3) of PMOS MP3 can be increased irrespective of the fluctuation range of the potential at the commonly connected sources of NMOS MN1 and NMOS MN2. Because the dynamic range can substantially be set to the power supply voltage range, the offset voltage between the output terminals can be set to zero for the large output load current.

The amplifier circuit having the current mirror configuration including PMOS MP6, PMOS MP7, PMOS MP8, PMOS MP9, NMOS MN6, NMOS MN7, NMOS MN8, and NMOS MN9 becomes redundant from the viewpoint of simply spread dynamic range. This is attributed to the following facts. It is assumed that each transistor is removed in PMOS MP8, PMOS MP9, NMOS MN8, and NMOS MN9, it is assumed that the amplifier circuit has the current mirror configuration in which the gate and drain of NMOS MN6 is connected to the gate of NMOS MN7, and it is assumed that the input of the bias control differential amplifier circuit is led out from the drains of PMOS MP6 and PMOS MP7. In such cases, the offset voltage between the output terminals becomes zero under the condition that the drain potentials of PMOS MP6 and PMOS MP7 are equalized to each other. Because the drain potential of PMOS MP6 depends on the gate-source voltage VGS of PMOS MP6, sometimes the condition that the offset voltage between the output terminals becomes zero cannot be satisfied even if the current passed through NMOS MN3 is changed by the bias control differential amplifier circuit. In order to avoid the problem, the amplifier circuit has the seemingly-redundant configuration including PMOS MP8, PMOS MP9, NMOS MN8, and NMOS MN9.

As illustrated in FIG. 4, a current I5 passed through NMOS MN5 in the circuit of FIG. 4 has a current mirror relationship with a current I1 passed through NMOS MN1. That is, the current having the same value as the current passed through NMOS MN1 is passed through current mirror connection of NMOS MN4 and NMOS MN5 through current mirror connection of PMOS MP1 and PMOS MP6, current mirror connection of NMOS MN6 and NMOS MN8, and current mirror connection of PMOS MP8 and PMOS MP4. Therefore, a current I6 passed through PMOS MP6 and NMOS MN6, a current I8 passed through NMOS MN8 and PMOS MP8, a current I4 passed through PMOS MP4 and NMOS MN4, and the current I5 have the same value as the current I1. In the circuit of FIG. 4, the main differential amplifier circuit 12 has a multi-stage configuration to enhance a voltage amplification factor thereof. The enhanced voltage amplification factor means that a denominator (gm·rds) of the equation (5) is increased, so that the offset reduction effect can further be expected compared with the first embodiment of FIG. 3.

Third Embodiment

Figure 5:
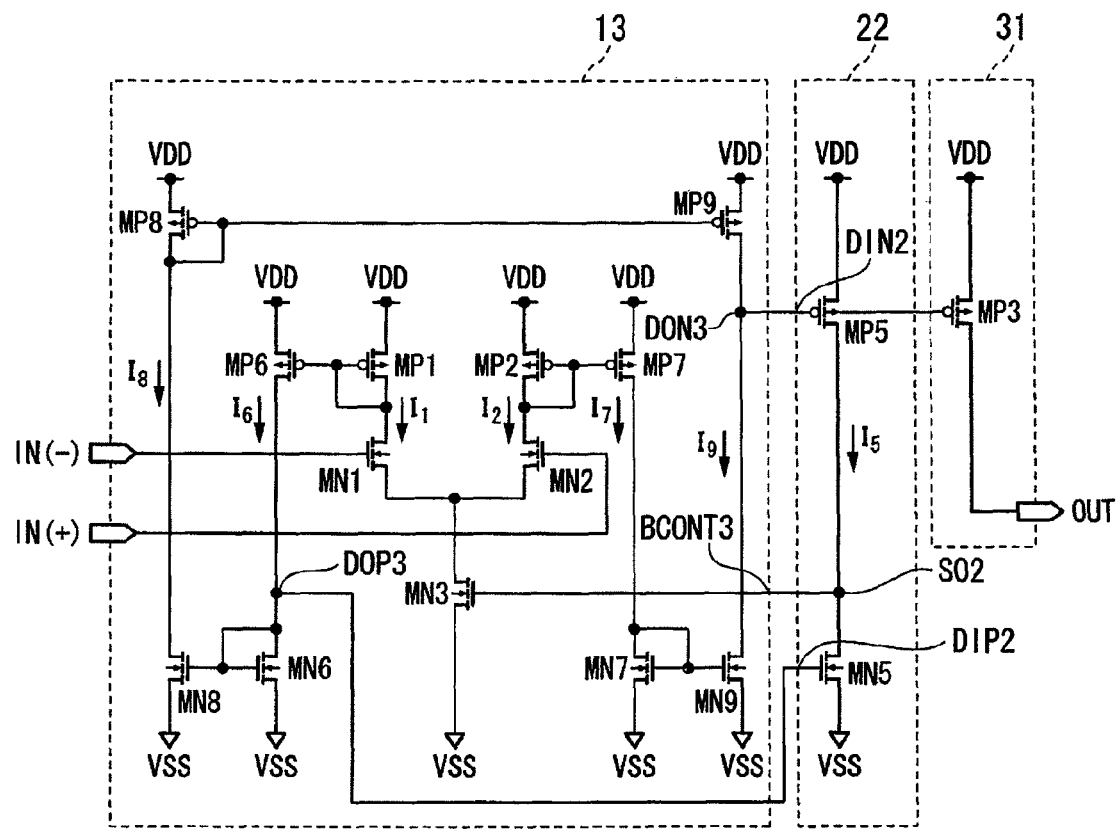
FIG. 5 is a block diagram illustrating the differential amplifier of the third embodiment.

A configuration of a differential amplifier 130 that is of an example of the differential amplifier 100 according to a third embodiment will be described with reference to FIG. 5. FIG. 5 is a block diagram illustrating the differential amplifier 130. The differential amplifier 130 includes a main differential amplifier circuit 13, a bias control differential amplifier circuit 22, and the open drain output circuit 31. In the differential amplifier 130 of FIG. 5, the same component as that of FIG. 2 is designated by the same numeral, and the main differential amplifier circuit 13 and bias control differential amplifier circuit 22 having different configurations are described. The main differential amplifier circuit 13 of the differential amplifier 130 includes NMOS MN1, NMOS MN2, NMOS MN3, NMOS MN6, NMOS MN7, NMOS MN8, NMOS MN9, PMOS MP1, PMOS MP2, PMOS MP6, PMOS MP7, PMOS MP8, and PMOS MP9.

In the main differential amplifier circuit 13, the gate of NMOS MN1 is connected to the negative input terminal IN(−). The gate of NMOS MN2 is connected to the positive input terminal IN(+), and the source of NMOS MN2 is connected to the source of NMOS MN1. In NMOS MN3, the gate indicates a circuit point BCONT3, the source is connected to the ground potential VSS, and the drain is connected to the source of NMOS MN1. In PMOS MP1, the source is connected to the power supply VDD, the drain is connected to the drain of NMOS MN1, and the gate is connected to the drain of itself. In PMOS MP6, the source is connected to the power supply VDD, and the gate is connected to the gate of PMOS MP1. In NMOS MN6, the source is connected to the ground potential VSS, the drain is connected to the drain of PMOS PN6, and the gate indicating a circuit point DOP3 is connected to the drain of itself. In NMOS MN8, the source is connected to the ground potential VSS, and the gate is connected to the gate of NMOS MN6.

In PMOS MP2, the source is connected to the power supply VDD, the drain is connected to the drain of NMOS MN2, and the gate is connected to the drain of itself. In PMOS MP7, the source is connected to the power supply VDD, and the gate is connected to the gate of PMOS MP2. In NMOS MN7, the source is connected to the ground potential VSS, the drain is connected to the drain of PMOS MP7, and the gate is connected to the drain of itself. In NMOS MN9, the source is connected to the ground potential VSS, and the gate is connected to the gate of NMOS MN7. In PMOS MP8, the source is connected to the power supply VDD, the drain is connected to the drain of NMOS MN8, and the gate is connected to the drain of itself. In PMOS MP9, the source is connected to the power supply VDD, the drain indicating the circuit point DON3 is connected to the drain of NMOS MN9, and the gate is connected to the gate of PMOS MP8.

The bias control differential amplifier circuit 22 of the differential amplifier 130 includes NMOS MN5 and PMOS MP5. In PMOS MP5 of the bias control differential amplifier circuit 22, the source is connected to the power supply VDD, the gate indicating the circuit point DIN2 is connected to the drain (circuit point DON3) of PMOS MP9, and the drain indicating the circuit point SO2 is connected to the gate of NMOS MN3. In NMOS NM5, the source is connected to the ground potential VSS, the drain is connected to the drain of PMOS MP5, and the gate indicating the circuit point DIP2 is connected to the gate (circuit point DOP3) of NMOS MN6. The gate indicating the input of the open drain output circuit 31 is connected to the drain indicating circuit point DON3 of MOS MP9.

The bias control differential amplifier circuit 22 is an example in which the configuration of the bias control differential amplifier circuit 21 is simplified. The bias control differential amplifier circuit 22 includes the pair of PMOS MP5 and NMOS MN5. The gate of NMOS MN5 is connected to the gate of NMOS MN6. The bias control differential amplifier circuit 21 includes PMOS MP4, PMOS MP5, NMOS MN4, and NMOS MN5. On the other hand, PMOS MP4 and NMOS MN4 are neglected in the bias control differential amplifier circuit 22. In an equilibrium state in which the offset voltage between the output terminals of the differential amplifier circuit becomes zero, the currents I1 and I2 passed through NMOS MN1 and NMOS MN2 are equal to each other, and therefore the current I5 passed through NMOS MN5 is equalized to the case of FIG. 4. Accordingly, the bias control differential amplifier circuit 22 can be implemented.

In the differential amplifier 120 of FIG. 4, the current I5 passed through NMOS MN5 has the current mirror relationship with the current I1 passed through NMOS MN1. Specifically, the current having the same value as the current passed through NMOS MN1 is passed through the current mirror connection of NMOS MN4 and NMOS MN5 through the current mirror connection of PMOS MP1 and PMOS MP6, the current mirror connection of NMOS MN6 and NMOS MN8, and the current mirror connection of PMOS MP8 and PMOS MP4. Accordingly, when the gate of NMOS MN5 is connected to the gate of NMOS MN6, PMOS MP4 and NMOS MN4 can be neglected. Although the main differential amplifier circuit of the third embodiment has the same basic operation as the main differential amplifier circuit 12, the main differential amplifier circuit 13 differs from the main differential amplifier circuit 12 in the connection to the bias control differential amplifier circuit 22.

Fourth Embodiment

Figure 6:
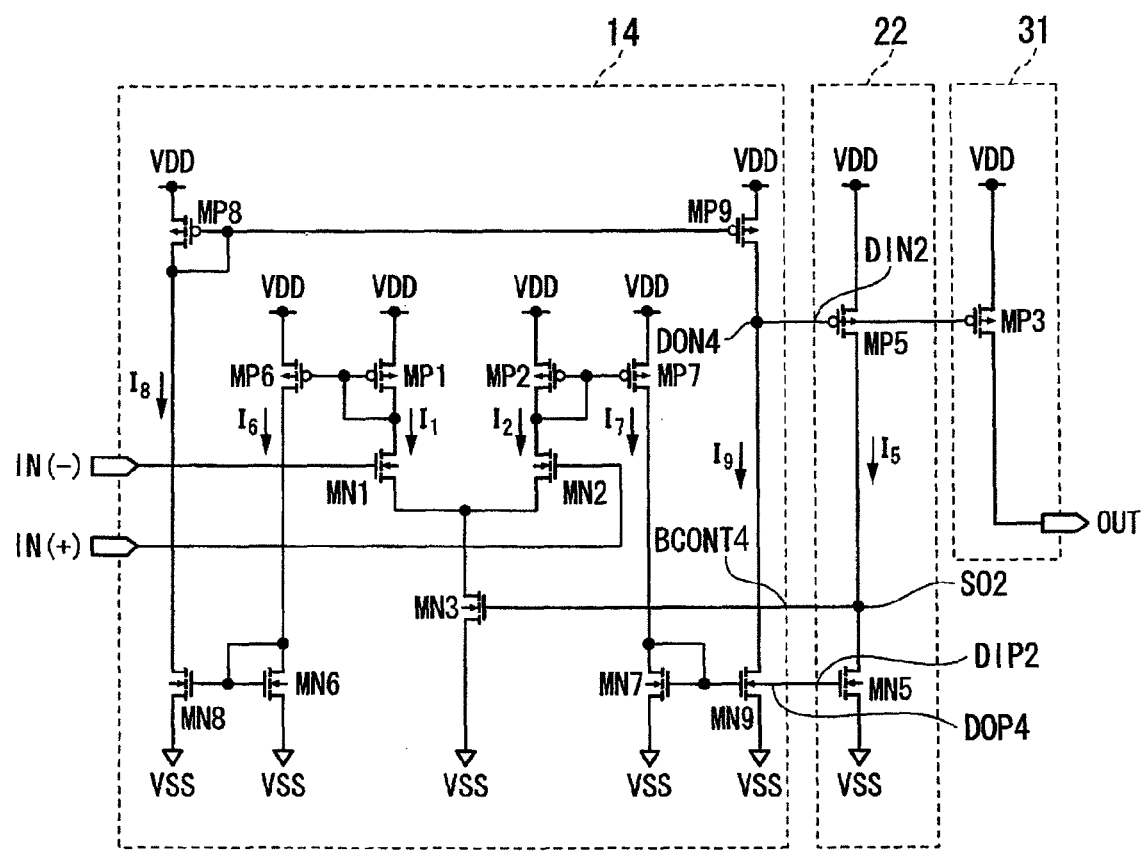
FIG. 6 is a block diagram illustrating the differential amplifier of the fourth embodiment.

A configuration of a differential amplifier 140 that is of a specific example of the differential amplifier 100 according to a fourth embodiment will be described with reference to FIG. 6. FIG. 6 is a block diagram illustrating the differential amplifier 140. The differential amplifier 140 includes a main differential amplifier circuit 14, the bias control differential amplifier circuit 22, and the open drain output circuit 31. In the differential amplifier 110 of FIG. 6, the same component as that of FIGS. 2 and 5 is designated by the same numeral, and the main differential amplifier circuit 14 having the different configuration is described. The main differential amplifier circuit 14 of the differential amplifier 120 includes NMOS MN1, NMOS MN2, NMOS MN3, NMOS MN6, NMOS MN7, NMOS MN8, NMOS MN9, PMOS MP1, PMOS MP2, PMOS MP6, PMOS MP7, PMOS MP8, and PMOS MP9.

In the main differential amplifier circuit 14, the gate of NMOS MN1 is connected to the negative input terminal IN(−), the gate of NMOS MN2 is connected to the positive input terminal IN(+), and the source of NMOS MN2 is connected to the source of NMOS MN1. In NMOS MN3, the gate indicates a circuit point BCONT4, the source is connected to a ground potential VSS, the drain is connected to the source of NMOS MN1. In PMOS MP1, the source is connected to the power supply VDD, the drain is connected to the drain of NMOS MN1, and the gate is connected to the drain of itself. In PMOS MP6, the source is connected to the power supply VDD, and the gate is connected to the gate of PMOS MP1. In NMOS MN6, the source is connected to the ground potential VSS, the drain is connected to the drain of PMOS MP6, and the gate is connected to the drain of itself. In NMOS MN8, the source is connected to the ground potential VSS, and the gate is connected to the gate of NMOS MN6.

In PMOS MP2, the source is connected to the power supply VDD, the drain is connected to the drain of NMOS MN2, and the gate is connected to the drain of itself. In PMOS MP7, the source is connected to the power supply VDD, and the gate is connected to the gate of PMOS MP2. In NMOS MN7, the source is connected to the ground potential VSS, the drain is connected to the drain of PMOS MP7, and the gate is connected to the drain of itself. In NMOS MN9, the source is connected to the ground potential VSS, and the gate indicating the circuit point DOP4 is connected to the gate of NMOS MN7. In PMOS MP8, the source is connected to the power supply VDD, the drain is connected to the drain of NMOS MN8, and the gate is connected to the drain of itself. In PMOS MP9, the source is connected to the power supply VDD, the drain indicating the circuit point DON4 is connected to the drain of NMOS MN9, and the gate is connected to the gate of PMOS MP8.

The connection between the bias control differential amplifier circuit 22 and the open drain output circuit 31 will be described. The circuit point DIN1 of the bias control differential amplifier circuit 22 is connected to the drain indicating the circuit point DON4 of PMOS MP9. The circuit point DIP1 of the bias control differential amplifier circuit 22 is connected to the gate indicating the circuit point DOP4 of NMOS MN9. The circuit point SO1 of the bias control differential amplifier circuit 22 is connected to the gate indicating the circuit point BCONT4 of NMOS MN3. The gate indicating the input of the open drain output circuit 31 is connected to the drain indicating the circuit point DON4 of PMOS MP9.

The bias control differential amplifier circuit 22 includes the pair of PMOS MP5 and NMOS MN5. The gate of NMOS MN5 is connected to the gate of NMOS MN9. The bias control differential amplifier circuit 21 includes PMOS MP4, PMOS MP5, NMOS MN4, and NMOS MN5. On the other hand, PMOS MP4 and NMOS MN4 are neglected in the bias control differential amplifier circuit 22. In the equilibrium state in which the offset voltage between the output terminals of the differential amplifier circuit 13 becomes zero, the currents I1 and I2 passed through NMOS MN1 and NMOS MN2 are equal to each other, and therefore the current I5 passed through NMOS MN5 is equalized to the case of FIG. 4. Accordingly, the bias control differential amplifier circuit 22 can be implemented.

In the differential amplifier 120 of FIG. 6, the current I5 passed through NMOS MN5 has the current mirror relationship with the current I1 passed through NMOS MN1. Specifically, the current having the same value as the current passed through NMOS MN1 is passed through the current mirror connection of NMOS MN9 and NMOS MN5 through the current mirror connection of PMOS MP1 and PMOS MP6, the current mirror connection of NMOS MN6 and NMOS MN8, and the current mirror connection of PMOS MP8 and PMOS MP9. Accordingly, when the gate of NMOS MN5 is connected to the gate of NMOS MN9, PMOS MP4 and NMOS MN4 can be neglected. Although the main differential amplifier circuit of the fourth embodiment has the same basic operation as the main differential amplifier circuits 12 and 13, the main differential amplifier circuit 14 differs from the main differential amplifier circuits 12 and 13 in the connection to the bias control differential amplifier circuit 22.

Fifth Embodiment

Figure 7:
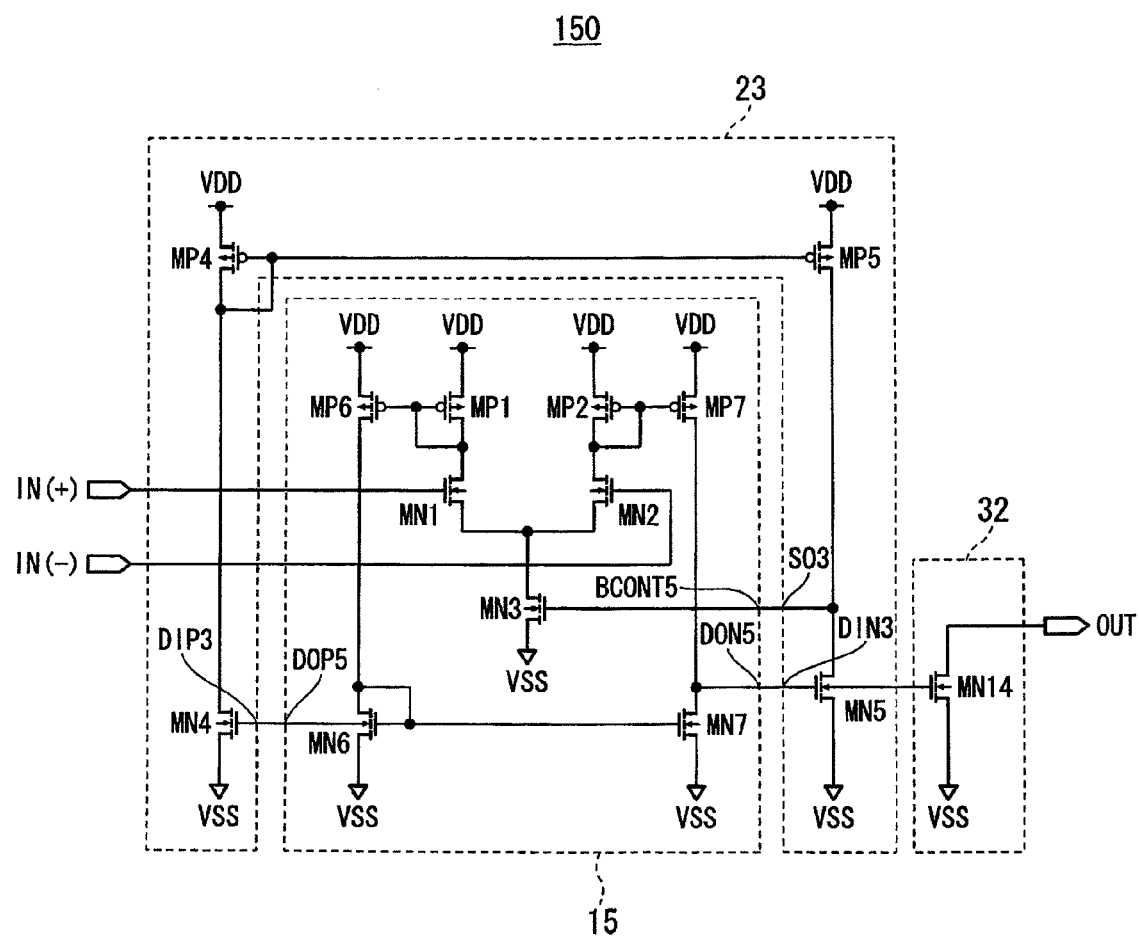
FIG. 7 is a block diagram illustrating the differential amplifier of the fifth embodiment.

A configuration of a differential amplifier 150 that is of a specific example of the differential amplifier 100 according to a fifth embodiment will be described with reference to FIG. 7. FIG. 7 is a block diagram illustrating the differential amplifier 150. The differential amplifier 150 includes a main differential amplifier circuit 15, a bias control differential amplifier circuit 23, and an open drain output circuit 32. The main differential amplifier circuit 15 of the differential amplifier 150 includes NMOS MN1, NMOS MN2, NMOS MN3, NMOS MN6, NMOS MN7, PMOS MP1, PMOS MP2, PMOS MP6, and PMOS MP7.

In the main differential amplifier circuit 15, the gate of NMOS MN1 is connected to the positive input terminal IN(+), the gate of NMOS MN2 is connected to the negative input terminal IN(−), and the source of NMOS MN2 is connected to the source of NMOS MN1. In NMOS MN3, the gate indicates the circuit point BCONT5, the source is connected to the ground potential VSS, and the drain is connected to the source of NMOS MN1. In PMOS MP1, the source is connected to the power supply VDD, the drain is connected to the drain of NMOS MN1, and the gate is connected to the drain of itself. In PMOS MP6, the source is connected to the power supply VDD, and the gate is connected to the gate of PMOS MP1. In NMOS MN6, the source is connected to the ground potential VSS, the drain is connected to the drain of PMOS MP6, and the gate indicating the circuit point DOP5 is connected to the drain of itself.

In PMOS MP2, the source is connected to the power supply VDD, the drain is connected to the drain of NMOS MN2, and the gate is connected to the gate of itself. In PMOS MP7, the source is connected to the power supply VDD, and the gate is connected to the gate of PMOS MP2. In NMOS MN7, the source is connected to the ground potential VSS, the drain indicating the circuit point DON5 is connected to the drain of PMOS MP7, and the gate is connected to the gate of NMOS MN6.

The open drain output circuit 32 includes NMOS MN14. In NMOS MN14 of the open drain output circuit 32, the source is connected to the ground potential VSS, the gate is connected to the drain of NMOS MN7, and the drain is connected to the output terminal OUT.

The bias control differential amplifier circuit 23 includes NMOS MN4, NMOS MN5, PMOS MP4, and PMOS MP5. In NMOS MN4 of the bias control differential amplifier circuit 23, the source is connected to the ground potential VSS, and the gate indicating the circuit point DIP3 is connected to the gate of NMOS MN6. In NMOS MN5, the source is connected to the ground potential VSS, and the gate indicating the circuit point DIN5 is connected to the drain of NMOS MN7. In PMOS MP4, the source is connected to the power supply VDD, the drain is connected to the drain of NMOS MN4, and the gate is connected to the drain of itself. In PMOS MP5, the source is connected to the power supply VDD, the drain indicating the circuit point S03 is connected to the gate of NMON MN3 and the drain of NMOS MN5, and the gate is connected to the gate of PMOS MP4.

Depending on the type of the load circuit, sometimes the NMOS open drain output is more suitable than the PMOS open drain output. The fifth embodiment is suitable for such cases. PMOS MP4, PMOS MP5, NMOS MN4, and NMOS MN5 in the bias control differential amplifier circuit 23 perform the operation for controlling the bias of the main differential amplifier circuit 15 such that the drain potentials of NMOS MN6 and NMOS MN7 in the main differential amplifier circuit 15 are equal to each other.

Sixth Embodiment

Figure 8:
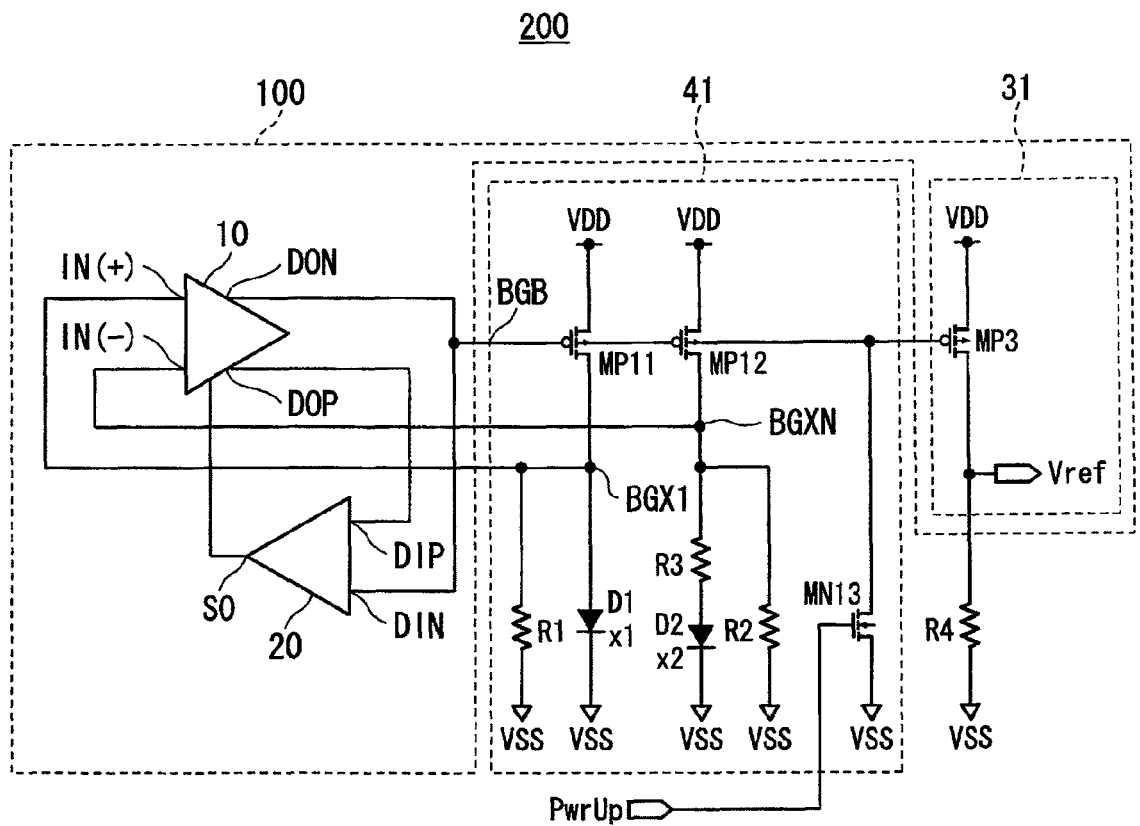
FIG. 8 is a schematic block diagram illustrating a reference voltage generating circuit according to a sixth embodiment of the invention.

A reference voltage generating circuit 200 in which the differential amplifier 100 is used will be described with reference to FIG. 8. FIG. 8 is the block diagram illustrating the reference voltage generating circuit 200. The reference voltage generating circuit 200 includes the differential amplifier 100 and a reference supply circuit 41. The differential amplifier 100 includes the main differential amplifier circuit 10, the bias control differential amplifier circuit 20, and the open drain output circuit 31. In the differential amplifier 200 of FIG. 8, the same component as that of FIG. 1 is designated by the same numeral, and the reference supply circuit 41 having the different configuration is described.

In the reference voltage generating circuit 210, the reference supply circuit 41 is the low-voltage bandgap supply circuit disclosed in Non-Patent Document 1. A configuration of the reference supply circuit 41 will be described below. In PMOS MP11 and PMOS MP12, the sources are connected to the power supply VDD, and the gates are connected in the current mirror manner to the gate of the MOS transistor in the open drain output circuit 31 of the differential amplifier. A diode D1 is connected in parallel to a resistor R1, the anode is connected to the drain of PMOS MP11, and the cathode is connected to the ground potential VSS. In a diode D2, the anode is connected to the drain of PMOS MP12 through a resistor R3, and the cathode is connected to the ground potential VSS. A resistor R2 is connected to the drain of PMOS MP12 and the ground potential VSS. In NMOS MN13, the gate is connected to an input terminal PwrUP, the drain is connected to the gate of the MOS transistor in the open drain output circuit 31, and the source is connected to the ground potential VSS. The drain of PNOS MP11 indicates a circuit point BGX1, and the drain is connected to the positive input terminal IN(+) of the differential amplifier. The drain of PNOS MP12 indicates a circuit point BGXN, and the drain is connected to the positive input terminal IN(−) of the differential amplifier.

Figure 10:
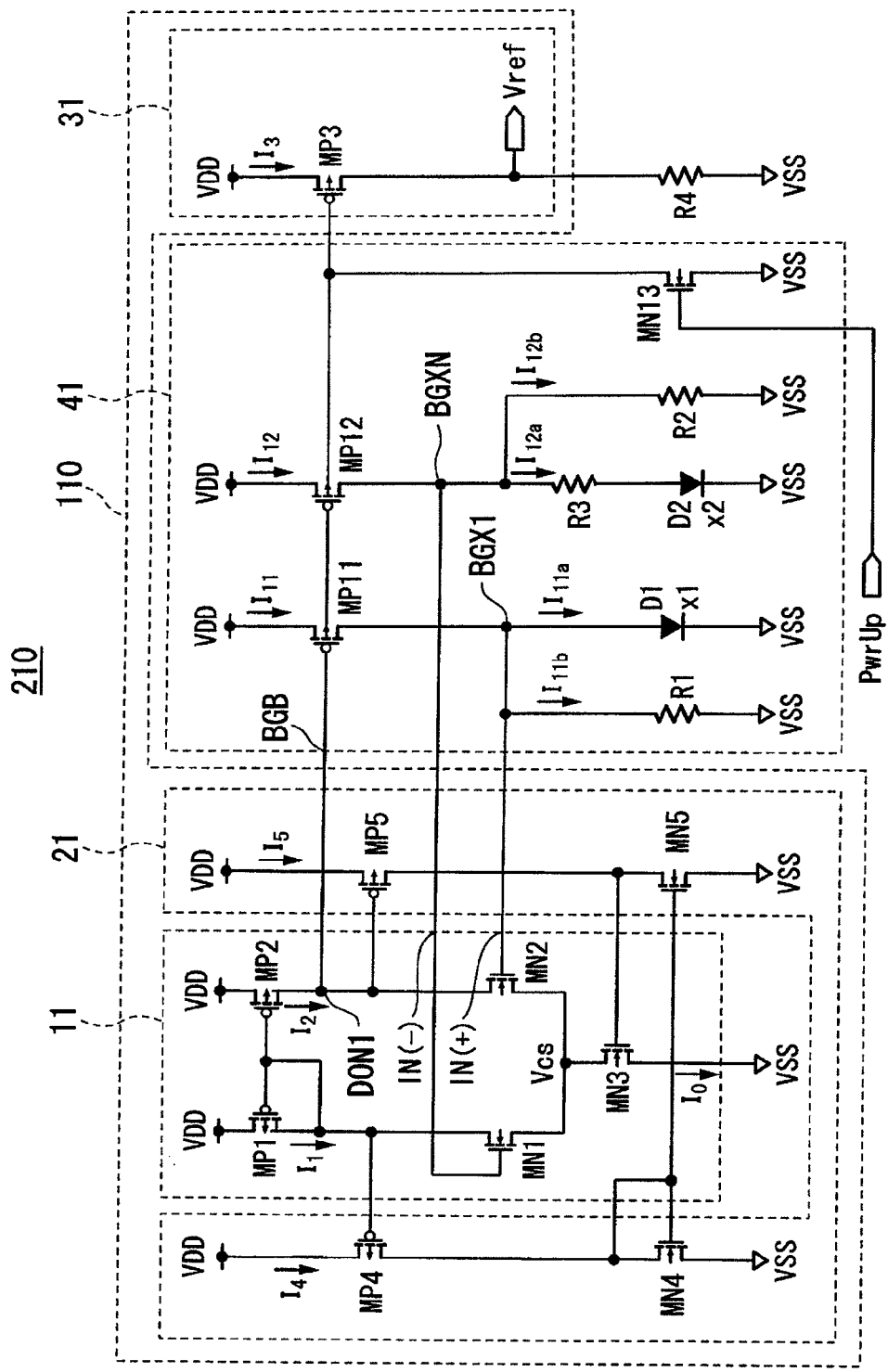
FIG. 10 is a block diagram (part 1) illustrating the reference voltage generating circuit of the sixth embodiment.

The differential amplifiers of the first to fifth embodiments can be applied to the differential amplifier 100. An example of the reference voltage generating circuit to which the specific configuration of the differential amplifier applied. FIG. 10 is a block diagram illustrating a reference voltage generating circuit 210. The reference voltage generating circuit 210 includes the differential amplifier 110 and the reference supply circuit 41. The differential amplifier 110 includes the main differential amplifier circuit 11, the bias control differential amplifier circuit 21, and the open drain output circuit 31. The circuit points BGXN, BGX1, and BGB of the reference supply circuit 41 are connected to the negative input terminal IN(−), positive input terminal IN(+), and circuit point DON1 of the differential amplifier 110, respectively.

Figure 11:
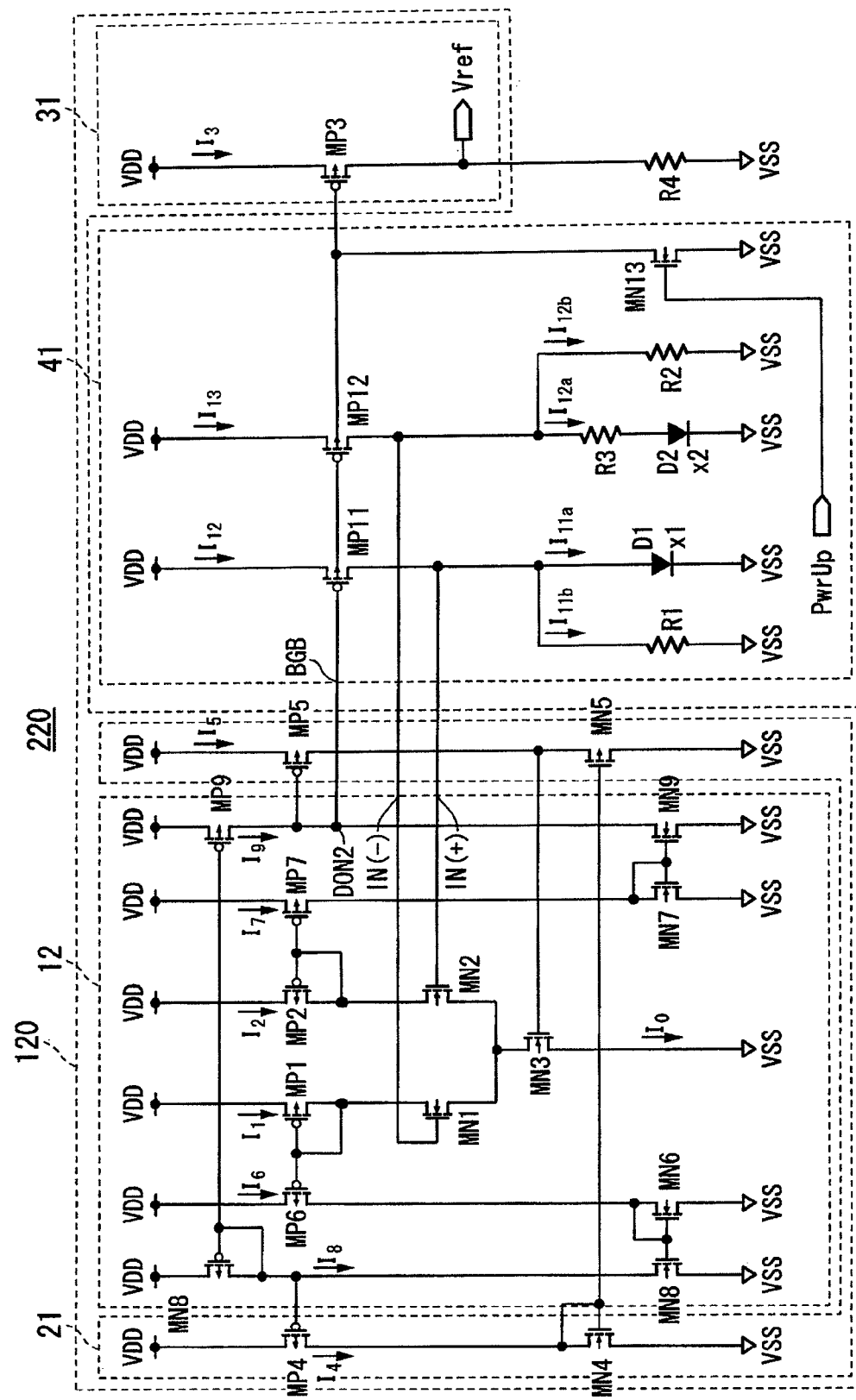
FIG. 11 is a block diagram (part 2) illustrating the reference voltage generating circuit of the sixth embodiment.

FIG. 11 is a block diagram illustrating a reference voltage generating circuit 220. The reference voltage generating circuit 220 includes the differential amplifier 120 and the reference supply circuit 41. The differential amplifier 120 includes the main differential amplifier circuit 12, the bias control differential amplifier circuit 21, and the open drain output circuit 31. The circuit points BGXN, BGX1, and BGB of the reference supply circuit 41 are connected to the negative input terminal IN(−), positive input terminal IN(+), and circuit point DON2 of the differential amplifier 120, respectively.

Figure 12:
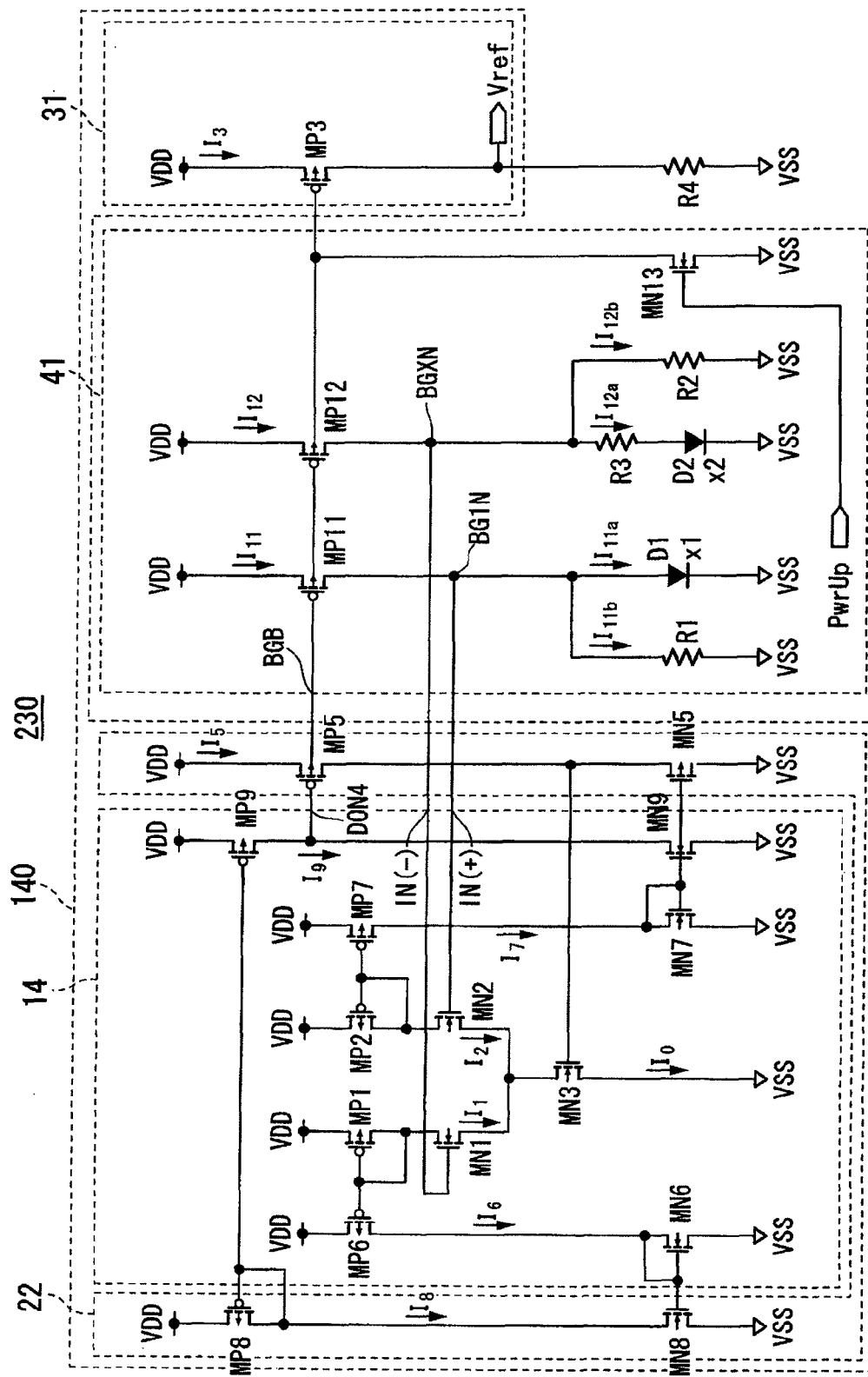
FIG. 12 is a block diagram (part 3) illustrating the reference voltage generating circuit of the sixth embodiment.

FIG. 12 is a block diagram illustrating a reference voltage generating circuit 230. The reference voltage generating circuit 230 includes the differential amplifier 140 and the reference supply circuit 41. The differential amplifier 140 includes the main differential amplifier circuit 14, the bias control differential amplifier circuit 22, and the open drain output circuit 31. The circuit points BGXN, BGX1, and BGB of the reference supply circuit 41 are connected to the negative input terminal IN(−), positive input terminal IN(+), and circuit point DON4 of the differential amplifier 140, respectively.

In these figures, the same component as that of each figure previously mentioned is designated by the same numeral, and the reference supply circuit 41 having the different configuration is described.

An operation of the low-voltage bandgap power supply will simply be described with reference to FIG. 9. A junction area ratio of the diode D1 and the diode D2 is set to 1:N. For the sake of convenience, it is assumed that the resistor R1 and the resistor R2 have the same value, and it is assumed that P-type channels of PMOS MP11, PMOS MP12, and PMOS MP3 are equal to one another in a gate width and a gate length. The differential amplifier including NMOS MN1, NMOS MN2, NMOS MN3, PMOS MP1, and PMOS MP2 controls currents I11, I12, and I3 such that potentials of complementary input voltages Vx1 and VxN of the differential amplifier circuit are equal to each other. That is, it is assumed that an equation (7) holds.

$$I11=I12=I13 \quad (7)$$

Because of Vx1=Vf1, Vx1=VxN, and R1=R2, currents I11$b$ and I12$b$ passed through the resistors R1 and R2 are expressed by an equation (8):

$$I11b=I12b=Vf1/R1 \quad (8)$$

Current I11$a$ passed through the diodes D1 and Current I12$a$ passed through the diodes D2 are expressed as follows. Where k is a Boltzmann constant, q is an elementary electric charge, and T is an absolute temperature.

$$I11a=Is \cdot A \cdot \exp\{VF1(kT/q)\} \quad (9)$$

$$I12a=Is \cdot NA \cdot \exp\{Vf2/(kT/q)\} \quad (10)$$

In the equations (9) and (10), Is is a backward saturation current of a junction per unit area, and A and NA (=N×A) are a junction area of the diode D1 and the diode D2. Because PMOS MP11 and PMOS MP12 constitute the current mirror circuit that includes PMOS transistors having the same channel size, the current passed through the diodes D1 and D2 are equal to each other (I11$a$=I12$a$). When a ratio of the equations (9) and (10) is computed to obtain a difference between Vf1 and Vf2, the following equation (11) is obtained:

$$Vf1-Vf2=(kT/q) \cdot \ln(N) \quad (11)$$

Because the complementary input voltages of the differential amplifier circuit are equal to each other by virtual short circuit (Vx1=VxN), the equation (11) is equal to a voltage dVf applied to the resistor R3, thereby the following equation (12) is obtained:

$$dVf=Vf1-Vf2=(kT/q) \cdot \ln(N) \quad (12)$$

I11$a$=I12$a$ is obtained from the equations (7) and (8), and the current I12$a$ passed through the resistor R3 from the equation (12) is expressed as follows from the equation (13):

$$I11a=I12a=dVf/R3=(1/R3) \cdot (kT/q) \cdot \ln(N) \quad (13)$$

Therefore, the current I3 passed through PMOS MP3 is expressed by the following equation (14):

$$I3=I12=I12a+I12b=(1/R3) \cdot (kT/q) \cdot \ln(N)+Vf1/R1 \quad (14)$$

The supplied reference voltage Vref is expressed by the following equation (15):

$$Vref=R4 \cdot I3=(R4/R1) \cdot \{Vf1+(R1/R3) \cdot (kT/q) \cdot \ln(N)\} \quad (15)$$

The parenthesis {Vf1+(R1/R3)·(kT/q)·ln(N)} of the equation (15) has the same shape as the normal bandgap power supply. A first term of Vf1 in the parenthesis {Vf1+(R1/R3)·

(kT/q)·ln(N)} has a negative temperature coefficient, and a second term of ((kT/q)·ln(N)) in the parenthesis {Vf1+(R1/R3)·(kT/q)·ln(N)} has a positive temperature coefficient, so that the temperature coefficient can cancel each other by properly adjusting a value of R1/R3. Although not described in detail, it is well known that the temperature coefficient becomes zero when the voltage expressed by the parenthesis {Vf1+(R1/R3)·(kT/q)·ln(N)} is about 1.2V (volt). This is expressed by the following equation (16):

$$Vf1+(R1/R3)\cdot(kT/q)\cdot\ln(N)=1.2(V) \tag{16}$$

Accordingly, when a ratio of the resistor R4 to the resistor R1 is set to about 0.5 to about 0.6 (R4/R1=0.5 to 0.6), a voltage of 0.6 to 0.72V (volt) (Vref=0.6 to 0.72V) can be obtained as the reference voltage. Thus, the reference voltage suitable to the bandgap power supply applying to the low-voltage semiconductor device whose power supply voltage is about 1.2V (volt) can be obtained. In the above description of the operation, it is assumed that the input offset voltage of the differential amplifier circuit has no influence.

Figure 9:
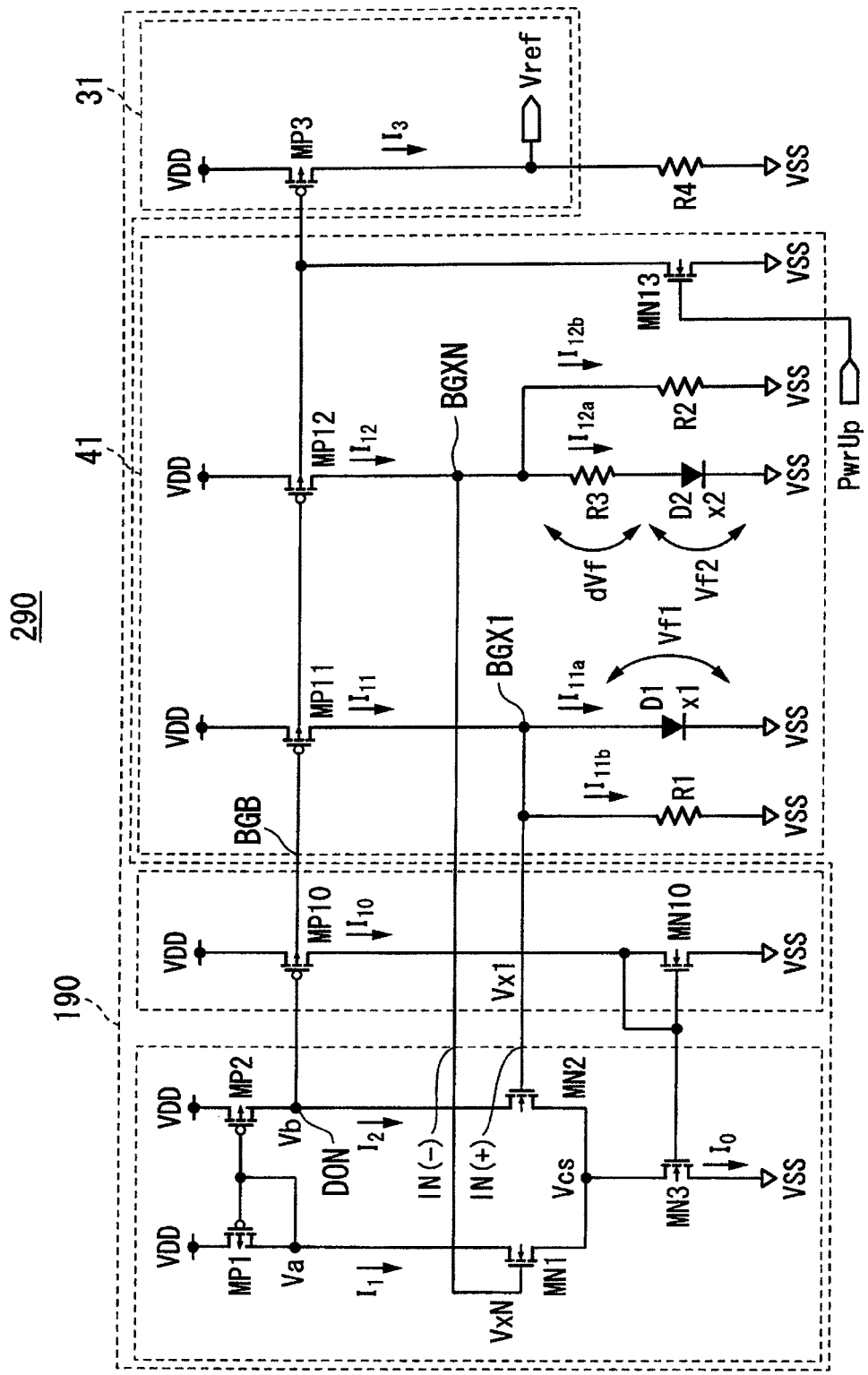
FIG. 9 is a block diagram illustrating a conventional reference voltage generating circuit.

In the actual circuit, for the following reason, the influence of the input offset voltage is hardly eliminated in the configuration of the differential amplifier circuit of FIG. 9. For the sake of convenience, it is assumed that PMOS MP1, PMOS MP2, PMOS MP11, PMOS MP12, and PMOS MP3 are equal to one another in the gate length and gate width.

Assuming that the tail current I0 of the differential amplifier circuit is lower than twice of the currents I11 and I12 passed through the diodes D1 and D2, the following equation (17) is obtained:

$$I0<2\cdot I11 \text{ or } I0<2\cdot I12 \tag{17}$$

When the input offset voltage is not generated, letting Vx1=VxN leads to 11=12, and Va=Vb is obtained. However, Va=Vb means I11=I12=I1=I2 because the PMOS MP11 and PMOS MP12 are equal to the current mirror connection. This is inconsistent with the assumption expressed by the equation (17). Because this means that Va=Vb does not hold, at least Vb>Va is obtained. I1>I2 holds in the currents I1 and I2 of differential amplifier circuit such that the currents expressed by the equation (14) are passed through PMOS MP11 and PMOS MP12. The current difference (I1-I2) directly causes the input offset voltage of NMOS MN1 and NMOS MN2. When the input offset voltage ΔVos is set to Vx1·VxN, ΔVos can be expressed by the following equation (18). Where gm is a mutual conductance of NMOS MN1 and NMOS MN2.

$$\Delta Vos=(I1-I2)/gm \tag{18}$$

The same holds true for the case in which the tail current I0 of the differential amplifier circuit is more than twice of the currents I11 and I12 passed through the diodes D1 and D2 (I0>2·I11 or I0>2·I12). That is, in order that ΔVos is set to zero, it is necessary that the tail current I0 satisfy a double of the currents I11 and I12 passed through NMOS MN11 and NMOS MN12 (I0=2·I11 or I0=2·I12. In FIG. 9, in order that the gate width of PMOS MP10 is set about double PMOS MP11 and PMOS MP12 to satisfy I0=2·I11 or I0=2·I12, it is necessary to keep a mirror ratio of NMOS MN3 and NMOS MN10 constant. However, a node potential Vcs at a common source that becomes the drain voltage of NMOS MN3 is expressed by an equation (19):

$$Vcs=Vfi-VGS(MN2) \tag{19}$$

The node potential Vcs is considerably lower than VGS (MN10) that is of the drain voltage of NMOS MN10, and NMOS MN3 is hardly operated in the saturation region. For example, in the following cases, Vf1=600 mV, VGS(MN2)=500 mV, and VGS(MN10)=600 mV NMOS MN3 is clearly operated in a linear region because of Vcs=100 mV. That is, even if the current I0 passed through NMOS MN3 is set to I0=2·I11 or I0=2·I12 under a specific condition, the current I0 is easily changed by the fluctuation in temperature or power supply voltage. In order to reduce the problem, it may be one of means that threshold voltages VT of NMOS MN1 and NMOS MN2 are lowered to form a depression type. However, it is necessary to prepare plural transistors having different threshold voltages VT one another. Therefore, in the circuit of FIG. 10 to which the differential amplifier circuit of FIG. 2 of the first embodiment is applied in order to solve the problem, the input offset voltage ΔVos can be set to zero with no use of a particular transistor even if the temperature or power supply voltage is fluctuated. In the circuit of FIG. 10, the current passed through NMOS MN3 is controlled such that the drain voltages of PMOS MP1 and PMOS MP2 are equal to each other. Therefore, the currents corresponding to I1 to I3, I11, and I12 of FIG. 9 of I1 to I3, I11, and I12 are equal to one another, and the right side of the equation (13) is always kept at zero.

Figure 13:
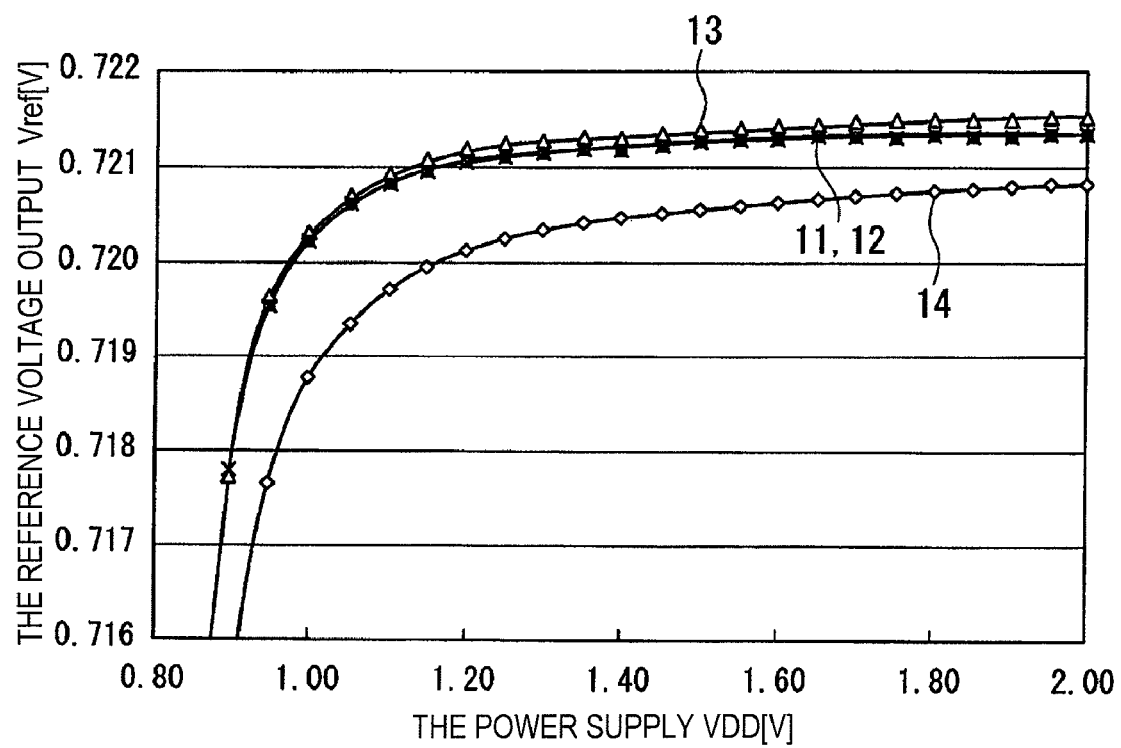
FIG. 13 is a graph (part 1) illustrating a characteristic of the reference voltage generating circuit of the sixth embodiment.

A characteristic of the reference voltage generating circuit of the sixth embodiment will be described with reference to FIGS. 13 and 14. FIG. 13 is a graph illustrating a reference voltage output characteristic of the reference voltage generating circuit. In the graph, the horizontal axis indicates the power supply voltage VDD (V (volt)), and the vertical axis indicates the voltage Vref (V (volt)) of the reference voltage output. A graph 11 expresses dependence of the reference voltage output supplied from the reference voltage generating circuit 210 on the change in power supply voltage. A graph 12 expresses dependence of the reference voltage output supplied from the reference voltage generating circuit 220 on the change in power supply voltage. A graph 13 expresses dependence of the reference voltage output supplied from the reference voltage generating circuit 230 on the change in power supply voltage. For the purpose of comparison, a graph 14 expresses dependence of the reference voltage output supplied from the conventional reference voltage generating circuit 290 of FIG. 9 on the change in power supply voltage. As can be seen from the graph of FIG. 13, gradients of the graphs 11, 12, and 13 become flattened compared with the graph of the conventional reference voltage generating circuit 290. That is, in the graphs 11, 12, and 13, even if the power supply voltage is changed, an amount of voltage change is decreased to stably operate the reference voltage generating circuit.

Figure 14:
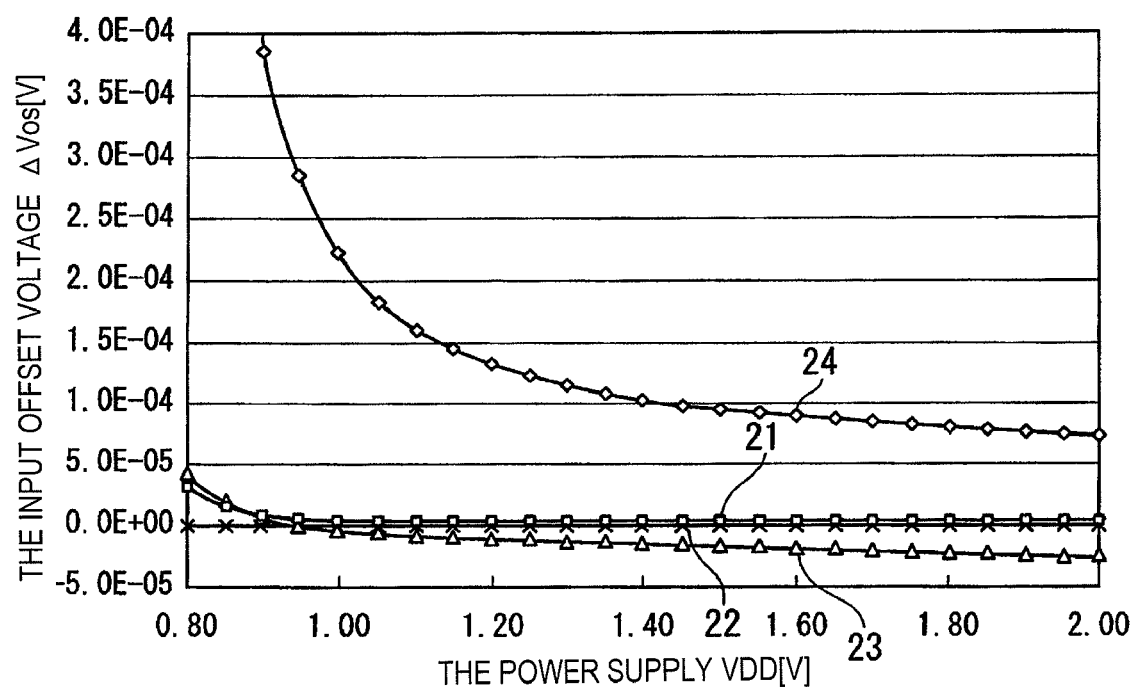
FIG. 14 is a graph (part 2) illustrating a characteristic of the reference voltage generating circuit of the sixth embodiment.

FIG. 14 is a graph illustrating an input offset voltage characteristic of the reference voltage generating circuit. In the graph, the horizontal axis indicates the power supply voltage VDD (V (volt)), and the vertical axis indicates the input offset voltage ΔVos (V (volt)). A graph 21 expresses dependence of the input offset voltage in the reference voltage generating circuit 210 on the change in power supply voltage. A graph 22 expresses dependence of the input offset voltage in the reference voltage generating circuit 220 on the change in power supply voltage. A graph 23 expresses dependence of the input offset voltage in the reference voltage generating circuit 230 on the change in power supply voltage. For the purpose of comparison, a graph 24 expresses dependence of the input offset voltage in the conventional reference voltage generating circuit 290 of FIG. 9 on the change in power supply voltage. As can be seen from the graph of FIG. 14, values of the graphs 21, 22, and 23 becomes smaller than that of the graph 24 of the conventional reference voltage generating circuit 290. That is, in the graphs 21, 22, and 23, even if the power supply voltage is changed, an amount of voltage change is decreased to stably operate the reference voltage generating circuit.

Seventh Embodiment

Figure 15:
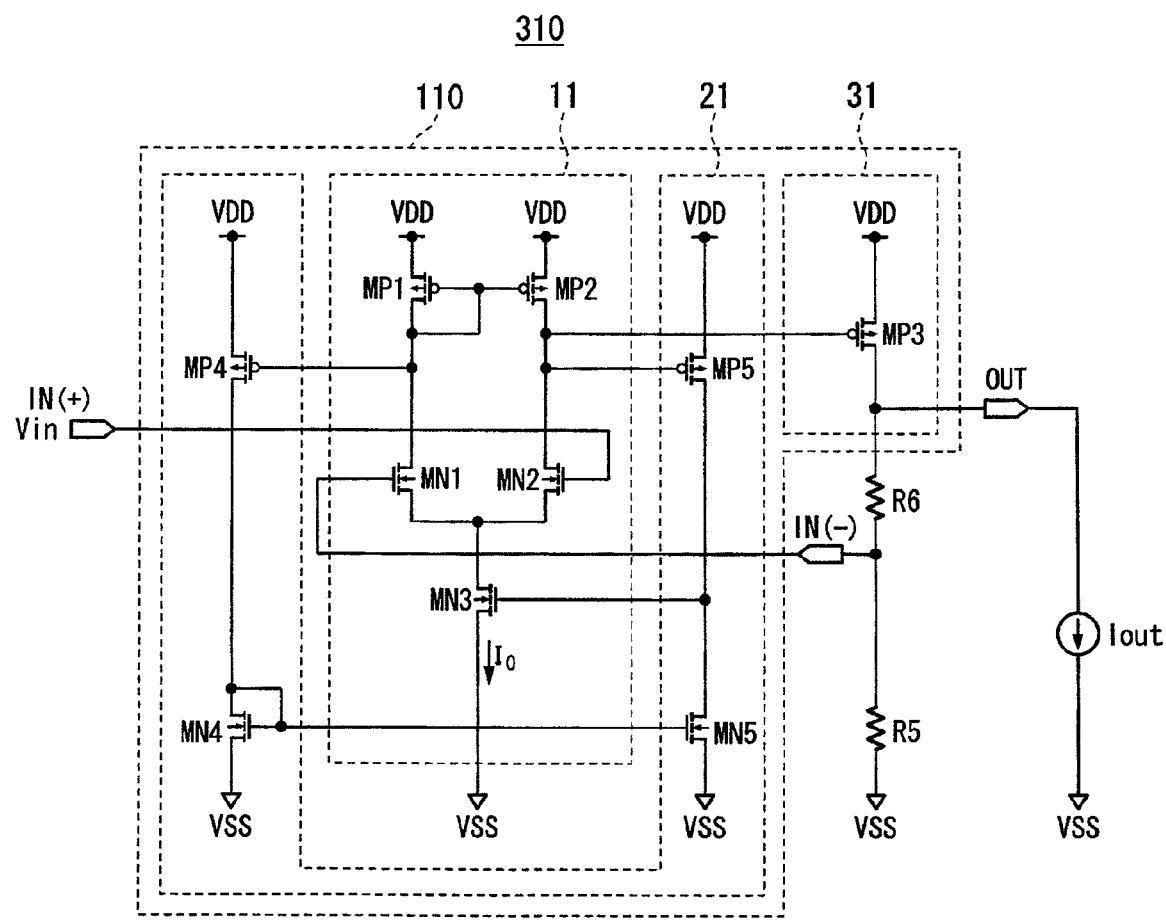
FIG. 15 is a block diagram illustrating a multiply circuit according to a seventh embodiment of the invention.

A multiply circuit according to another embodiment to which the differential amplifier of the invention is suitably applied will be described with reference to FIGS. 15 and 16. FIG. 15 is a block diagram illustrating a multiply circuit 310. The multiply circuit 310 includes the differential amplifier 110 and resistors R5 and R6. In the resistor 6, one of ends is connected to the output terminal of the differential amplifier 110, and the other end is connected to the ground potential VSS through the resistor R5 and to the negative input terminal IN(−) (inverting input terminal) of the differential amplifier 110. The resistors R5 and R6 are a multiply circuit constituting a feedback circuit. In the feedback circuit, the output voltage VOUT of the differential amplifier 110 is divided, and the divided voltage is fed back. An output voltage VOUT of the multiply circuit 310 is expressed by an equation (20):

$$VOUT=(1+R6/R5)\cdot Vin \quad (20)$$

Figure 16:
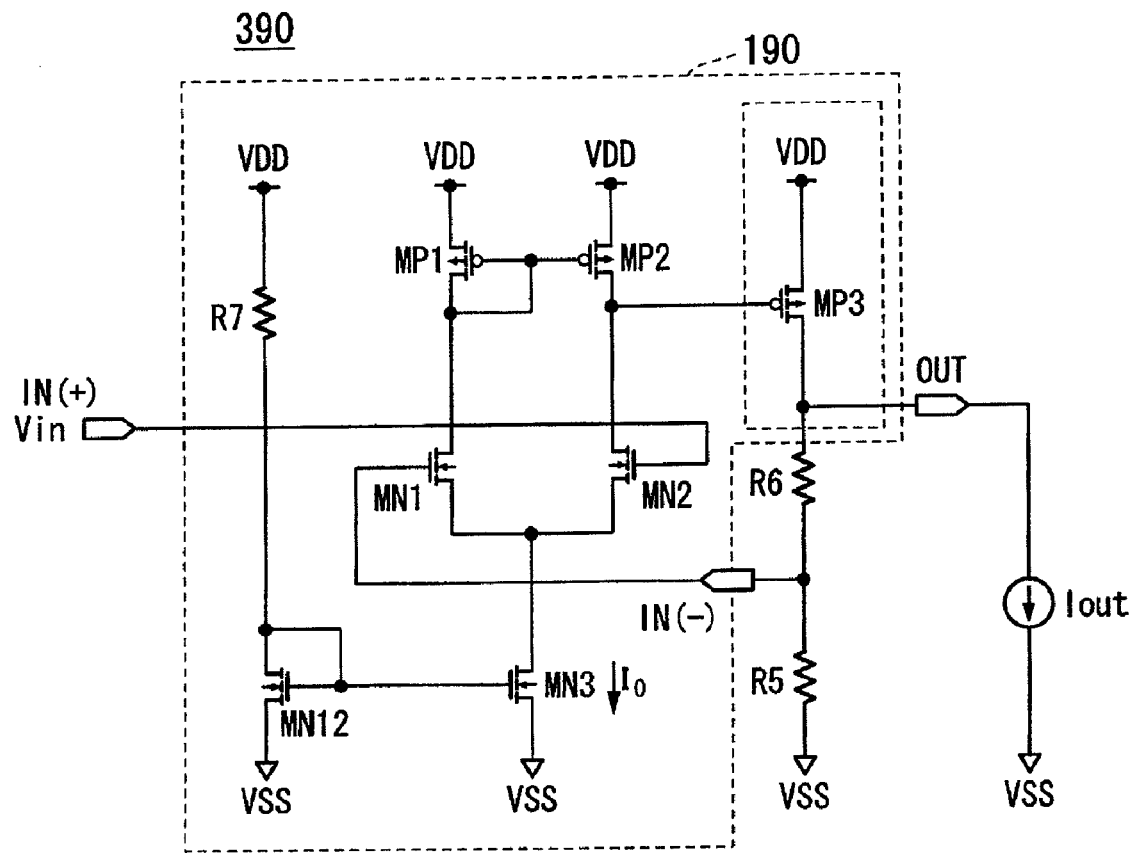
FIG. 16 is a block diagram illustrating a conventional multiply circuit.

FIG. 16 illustrates a conventional multiply circuit 390 for the purpose of comparison. In the differential amplifier 190 used in the multiply circuit 390, NMOS MN3 that controls the tail current of the differential input is connected to NMOS MN12 in the current mirror manner. Therefore, the current corresponding to the current defined by the resistor R7 and NMOS MN12 becomes the tail current passed through NMOS MN3.

Figure 17:
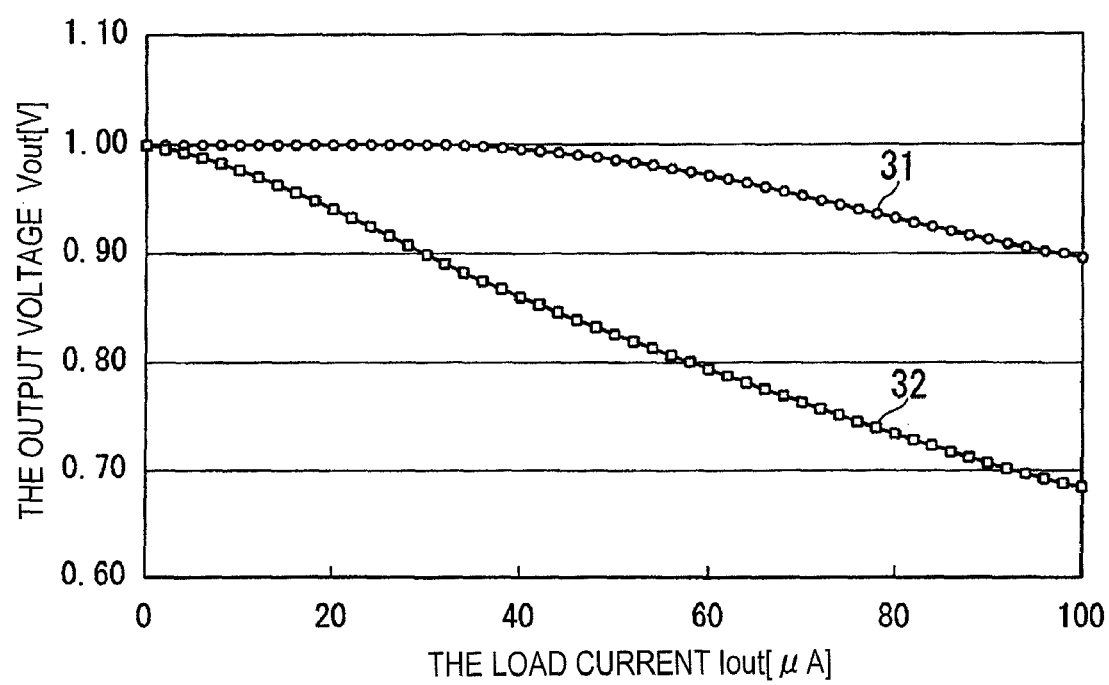
FIG. 17 is a graph illustrating a characteristic of the multiply circuit of the seventh embodiment.
Figure 18:
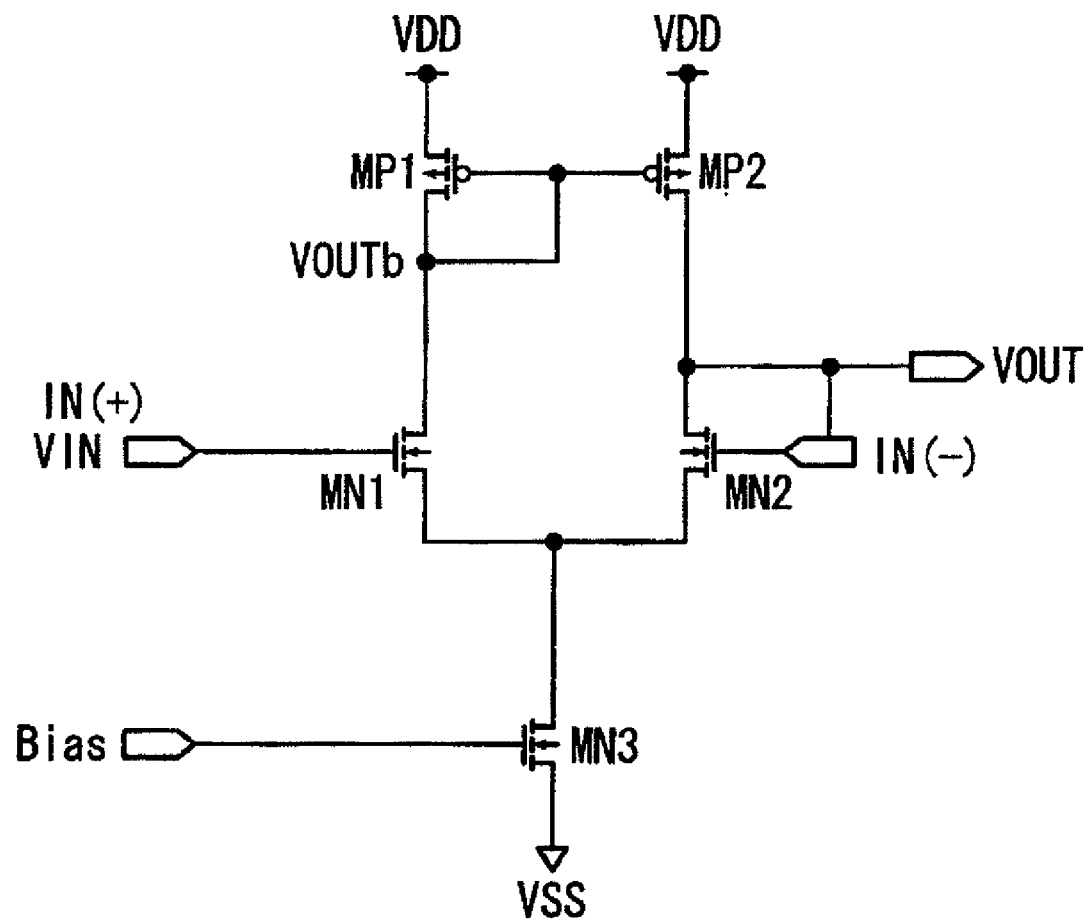
FIG. 18 is a block diagram illustrating a conventional voltage follower circuit.

An output voltage characteristic of the multiply circuit 310 will be described with reference to FIG. 17. FIG. 17 is a graph illustrating a relationship between the output voltage and the load current when the output voltage of the multiply circuit is set to 1V (volt) in the case of the load current of zero. In the graph, the horizontal axis indicates a load current Tout (µA (microampere)), the vertical axis indicates the output voltage ΔVos (V(volt)). A graph 31 expresses the output voltage characteristic of the multiply circuit 310. A graph 32 expresses the output voltage characteristic of the multiply circuit 390 in which the conventional differential amplifier 190 is used. In the graph 31 of the differential amplifier circuit of the seventh embodiment, although the output voltage tends to be lowered as the load current Iout is increased, the change in output voltage is not changed too much. On the other hand, in the graph 32 of the conventional circuit, the output voltage is largely fluctuated as the load current is increased. As a result of comparison of the graphs, the fluctuation in output voltage is improved in the differential amplifier circuit of the seventh embodiment.

An operation of the multiply circuit that obtains the characteristic will be described. For the sake of convenience, it is assumed that PMOS MP1, PMOS MP2, and PMOS MP3 of the differential amplifier 110 of FIG. 15 and the differential amplifier 190 of FIG. 16 are equal to one another in the size, and it is assumed that PMOS MP1, PMOS MP2, and PMOS MP3 have the same characteristic. Optimization of a circuit constant for obtaining a predetermined output voltage in the predetermined output voltage of zero in the multiply circuit 390 of FIG. 16 will be described based on the assumption. As is clear from the input offset voltage, the output is obtained without error when the tail current I0 passed through NMOS MN3 of FIG. 16 is set double the feedback current passed through resistors R5 and R6 that constitute the feed back circuit.

In the multiply circuit 390, in order to suppress a consumption current, the resistors R5 and R6 are set to sufficiently high resistance values, and the tail current I0 passed through NMOS MN3 is set to a smaller value. In such cases, the feedback current passed through the resistors R5 and R6 is reduced. In cases where the load current Iout is eliminated, an offset error is generated, when the large amount of tail currents are passed.

Further, when the load current Iout is increased, the input offset voltage is extremely degraded. This is attributed to the following facts. That is, in the multiply circuit 390, it is necessary that the gate potential of PMOS MP3 be lowered with increasing load current Iout. Therefore, it is necessary to increase the ratio of currents I1 and I2 by breaking down a balance between the currents I1 and I2 passed through NMOS MN1 and NMOS MN2 because the tail current I0 is set to a smaller value. Therefore, the input offset is remarkably degraded.

On the other hand, in the circuit of FIG. 15, the current I0 passed through NMOS MN3 is controlled by the bias control differential amplifier circuit 21 so as to become double the sum (that is, current passed through NMOS MP3) of the load current Iout and the feedback current passed through the resistors R5 and R6. Therefore, even if the load current Iout is increased, the bias control differential amplifier circuit 21 controls the input offset voltage such that the input offset voltage is minimized, so that a fluctuation range of the output voltage can be decreased.

In a circuit to which the differential amplifier is applied, when the input signal has a small voltage level, or when output current is fluctuated, sometimes the bias setting of the differential amplifier is hardly optimized. In such cases, when the differential amplifier of the invention is applied, the input offset voltage can be suppressed, and the error can be reduced in the reference voltage.

The invention is not limited to the embodiments, but various modifications can be made without departing from the scope of the invention. An element having a similar function can be applied to the constituent in the differential amplifier and reference voltage generating circuit of the invention, and there is no particular limitation to the number of components or connection mode. In the circuit configurations of the embodiments, the circuit element having the different conductivity type can be applied by replacing both the polarity of the power supply and the polarity of the circuit element. In the embodiment, each of the open drain output circuit 30, open drain output circuit 31, and open drain output circuit 32 includes one MOS transistor. Alternatively, each of the open drain output circuit 30, open drain output circuit 31, and open drain output circuit 32 may include plural MOS transistors.

The differential amplifier of the invention corresponds to the differential amplifier 100, the differential amplifier 110, the differential amplifier 120, the differential amplifier 130, the differential amplifier 140, and the differential amplifier 150. The main differential amplifier circuit of the invention corresponds to the main differential amplifier circuit 10, the main differential amplifier circuit 11, the main differential amplifier circuit 12, the main differential amplifier circuit 13, the main differential amplifier circuit 14, and the main differential amplifier circuit 15. The bias control differential amplifier circuit of the invention corresponds to the bias control differential amplifier circuit 20, the bias control differential amplifier circuit 21, the bias control differential amplifier circuit 22, and the bias control differential amplifier circuit 23. The open drain output circuit of the invention corresponds to the open drain output circuit 30, the open drain output circuit 31, and the open drain output circuit 32. The first open drain output circuit of the invention corresponds to the open drain output circuit 31. The second open drain output circuit of the invention corresponds to the open drain output circuit 32. The reference voltage generating circuit of the invention corresponds to the reference voltage generating circuit 200, the reference voltage generating circuit 210, the reference voltage generating circuit 220, and the reference voltage generating circuit 230.

The pair of differential amplifier circuits of the invention corresponds to the differential circuit 11*a* including the N-type MOS transistor (NMOS) NM1 and the P-type MOS transistor (PMOS). The current control circuit of the invention corresponds to the constant current circuit 11*c* (N-type MOS transistor (NMOS) MN3). The current mirror circuit of the invention corresponds to, for example, the current mirror circuit 11*b*. The differential amplifier unit of the invention corresponds to the main differential amplifier circuit 10, the main differential amplifier circuit 11, the main differential amplifier circuit 12, the main differential amplifier circuit 13, the main differential amplifier circuit 14, and the main differential amplifier circuit 15.

What is claimed is:

1. A differential amplifier comprising:
a main differential amplifier circuit that receives a pair of input signals and supplies a pair of output signals based on a difference between the input signals; and
a bias control differential amplifier circuit that receives the pair of output signals and controls a control terminal of the current-limiting transistor based on an offset voltage included in the output signals so as to reduce the offset voltage,
wherein the main differential amplifier circuit includes:
a current-limiting transistor;
a first input transistor that is connected between a common node point and the first output terminal, a control terminal of the first input transistor being connected to the first input terminal;
a second input transistor that is connected between the common node point and the second output terminal, a control terminal of the second input transistor being connected to the second input terminal; and
the current-limiting transistor that is connected between the common node point and a first power supply line, a control terminal of the current-limiting transistor receiving output of the bias control differential amplifier circuit, and
wherein the bias control differential amplifier circuit includes:
a third transistor that is connected between a second power supply line and a first node point, a control terminal of the third transistor being connected to the first output terminal;
a fourth transistor that is connected between the first node point and a first power supply line, a control terminal of the fourth transistor being connected to the first node point;
a fifth transistor that is connected between the second power supply line and the control terminal of the current-limiting transistor, a control terminal of the fifth transistor being connected to the second output terminal; and
a sixth transistor that is connected between the control terminal of the current-limiting transistor and the first power supply line, a control terminal of the sixth transistor being connected to the first node point.

2. A differential amplifier comprising:
a main differential amplifier circuit that receives a pair of input signals and supplies a pair of output signals based on a difference between the input signals;
a bias control differential amplifier circuit that receives the pair of output signals and controls a control terminal of the current-limiting transistor based on an offset voltage included in the output signals so as to reduce the offset voltage; and
wherein the main differential amplifier circuit includes:
a current-limiting transistor;
first and second input terminals that receive the pair of input signals;
a control terminal that supplies output from the bias control differential amplifier circuit to the control terminal of the current-limiting transistor, the current-limiting transistor defining a bias current passed through the main differential amplifier circuit; and
first and second output terminals that supply the pair of output signals,
wherein the bias control differential amplifier circuit includes:
third and fourth input terminals that receive the pair of output signals; and
an output terminal that is connected to the control terminal of the main differential amplifier circuit, and
wherein the differential amplifier further includes an open drain output circuit whose control terminal is connected to the second output terminal.

3. A differential amplifier comprising:
a main differential amplifier circuit that receives a pair of input signals and supplies a pair of output signals based on a difference between the input signals;
a bias control differential amplifier circuit that receives the pair of output signals and controls a control terminal of the current-limiting transistor based on an offset voltage included in the output signals so as to reduce the offset voltage; and
wherein the main differential amplifier circuit includes:
a current-limiting transistor;
a pair of differential amplifier circuits;
a current control circuit that is connected to the differential amplifier circuit; and
the differential amplifier unit that includes at least one current mirror circuit, and signal amplification is performed by one- or multi-stage amplifying unit.

4. A differential amplifier comprising:
a main differential amplifier circuit that includes a differential amplifier unit; and
an open drain output circuit that amplifies a signal supplied from the main differential amplifier circuit,
wherein when an offset voltage included in a differential output signal of the differential amplifier unit is detected, an operating point of the differential amplifier unit is controlled based on the offset voltage so as to reduce the offset voltage.

5. The differential amplifier as claimed in claim 4, further comprising:
a pair of complementary input terminals that includes a positive input terminal and a negative input terminal;
a control terminal into which a control signal defining a bias current is fed;
a main differential amplifier circuit that includes a complementary pair of output terminals;

an open drain output circuit that includes a MOS transistor, a gate being connected to one of the complementary pair of output terminals of the main differential amplifier circuit and a drain being connected to output terminal in the MOS transistor; and a bias control differential amplifier circuit in which the pair of complementary input terminals is connected to complementary output terminals of the main differential amplifier circuit and output is connected to a control terminal of the main differential amplifier circuit, respectively.

6. The differential amplifier as claimed in claim 4, wherein the differential amplifier unit includes:

a pair of differential amplifier circuits;

a current control circuit that is connected to the differential amplifier circuit; and at least one current mirror circuit, and signal amplification is performed by one- or multi-stage amplifying unit in the main differential amplifier circuit.

7. A differential amplifying method comprising:

accepting input signals to a pair of complementary input terminals of a main differential amplifier circuit;

obtaining a complementary signals by amplifying the input signals based on a control signal defining a bias current and supplied to a control terminal of the main differential amplifier circuit;

outputting the complementary signals from a complementary pair of output terminals of the main differential amplifier circuit;

supplying only one of the complementary signals to a MOS transistor;

outputting a signal from a drain of a MOS transistor;

obtaining the control signal by differential amplifying the first complementary signals; and supplying the control signal to the control terminal.

8. A reference voltage generating method by a reference voltage generating circuit including a bandgap power supply and a differential amplifier unit, the differential amplifier unit including a main differential amplifier circuit performing overall differential amplification and a open drain output circuit amplifying a differential output signal supplied from the main differential amplifier circuit, the differential amplifier unit outputs a signal amplified by the open drain output circuit, the reference voltage generating method comprising:

supplying signals outputted from the bandgap power supply to the main differential amplifier circuit;

detecting an offset voltage included in a differential output signal outputted from the differential amplifier unit as the differential amplifier unit accepts the signals outputted from the bandgap power supply; and reducing the offset voltage included in the differential output signals by controlling an operating point of the main differential amplifier unit based on the offset voltage.

* * * * *